United States Patent
Ueyanagi et al.

(10) Patent No.: US 7,412,894 B2
(45) Date of Patent: *Aug. 19, 2008

(54) PRESSURE SENSING DEVICE INCORPORATING PRESSURE SENSING CHIP IN RESIN CASE

(75) Inventors: Katsumichi Ueyanagi, Nagano (JP); Shigeru Shinoda, Nagano (JP); Kimihiro Ashino, Nagano (JP); Kazunori Saito, Nagano (JP)

(73) Assignee: Fuji Electric Device Technology Co., Ltd. (JP)

(*) Notice: Subject to any disclaimer, the term of this patent is extended or adjusted under 35 U.S.C. 154(b) by 61 days.

This patent is subject to a terminal disclaimer.

(21) Appl. No.: 10/926,797

(22) Filed: Aug. 26, 2004

(65) Prior Publication Data

US 2005/0087020 A1 Apr. 28, 2005

(30) Foreign Application Priority Data

Aug. 29, 2003 (JP) ............................. 2003-307265
Apr. 26, 2004 (JP) ............................. 2004-130368

(51) Int. Cl.
*G01L 9/00* (2006.01)

(52) U.S. Cl. ....................................................... 73/753

(58) Field of Classification Search ................... 73/753, 73/754, 715
See application file for complete search history.

(56) References Cited

U.S. PATENT DOCUMENTS

| | | | | |
|---|---|---|---|---|
| 4,314,225 A | * | 2/1982 | Tominaga et al. | 338/4 |
| 5,186,055 A | * | 2/1993 | Kovacich et al. | 73/727 |
| 5,421,956 A | * | 6/1995 | Koga et al. | 216/2 |
| 5,454,270 A | | 10/1995 | Brown et al. | |
| 5,859,759 A | * | 1/1999 | Moriyama et al. | 361/283.4 |
| 6,055,865 A | * | 5/2000 | Ichihashi | 73/754 |
| 6,176,137 B1 | * | 1/2001 | Sasaki et al. | 73/754 |
| 6,389,903 B1 | | 5/2002 | Oba et al. | |
| 6,457,368 B1 | * | 10/2002 | Sasaki et al. | 73/753 |
| 6,487,911 B1 | | 12/2002 | Frackelton et al. | |
| 6,578,426 B2 | | 6/2003 | Imai et al. | |

(Continued)

FOREIGN PATENT DOCUMENTS

JP 01-150832 6/1989

(Continued)

*Primary Examiner*—Max Noori
(74) *Attorney, Agent, or Firm*—Rossi, Kimms & McDowell LLP

(57) ABSTRACT

A pressure sensor device includes a pressure sensor chip containing a diaphragm, piezo-resistors, an amplifying circuit and various kinds of adjusting circuits, and a base member to which the sensor chip is joined, with the diaphragm facing a through hole of the base member. The base member and a metallic member are joined so that their respective through holes communicate with each other. The metallic member is bonded to a resin case, and a signal terminal of the resin case and the pressure sensor chip are electrically connected to form a pressure sensor cell. With an O-ring attached to the metallic member and with the resin case pressed from above, the pressure sensor cell is secured to an enclosure, such as an oil enclosing block. Using a connector having a bending section and a threaded section, the pressure sensor cell can be secured to the connector by bending the bending section over the pressure sensor cell. The threaded section can be screwed into the enclosure.

29 Claims, 19 Drawing Sheets

U.S. PATENT DOCUMENTS

| | | |
|---|---|---|
| 6,584,851 B2 | 7/2003 | Yamagishi et al. |
| 6,591,689 B2 * | 7/2003 | Nidan et al. .................. 73/754 |
| 6,619,132 B2 | 9/2003 | Imai et al. |
| 6,634,567 B2 | 10/2003 | Hotta et al. |
| 6,962,081 B2 * | 11/2005 | Ueyanagi et al. ......... 73/514.18 |
| 7,143,651 B2 | 12/2006 | Sasaki et al. |
| 7,210,357 B2 * | 5/2007 | Tanaka et al. .................. 73/754 |
| 7,231,830 B2 * | 6/2007 | Otsuka et al. .................. 73/756 |
| 2002/0005072 A1 * | 1/2002 | Nidan et al. .................. 73/715 |
| 2004/0200286 A1 * | 10/2004 | Mast .......................... 73/715 |

FOREIGN PATENT DOCUMENTS

| | | |
|---|---|---|
| JP | 2000-055762 | 2/2000 |
| JP | 2002-168718 | 6/2002 |
| JP | 2002-202215 | 7/2002 |
| JP | 2004-184355 A | 7/2004 |

* cited by examiner

PRESSURE SENSING DEVICE INCORPORATING PRESSURE SENSING CHIP IN RESIN CASE

BACKGROUND

A pressure sensor device is typically mounted on a block, such as an oil enclosing block of a transmission of an automobile or an oil block of a hydraulic actuator, to measure pressure, and uses a semiconductor pressure sensor chip, applying a piezo-resistance effect as a sensor element. The semiconductor pressure sensor has an arrangement in which a plurality of semiconductor strain gauges, connected in a bridge circuit, are formed on a diaphragm made of a material, such as single crystal silicon, that exhibits a piezo-resistance effect. Deformation of the diaphragm by a pressure variation causes a variation corresponding to the amount of the deformation, in the gauge resistance of the semiconductor strain gauge. The amount of variation is output from the bridge circuit as a voltage signal.

FIGS. 16-19 illustrate some well known pressure sensor devices. The pressure sensor device shown in FIG. 16 is provided with a joint 1 having a threaded section, a flange member 3 for screwing the joint 1 into a section to which the device is installed. The pressure sensor 2 outputs a voltage signal corresponding to the amount of variation in pressure as explained above. It includes a circuit board 4 mounting a circuit chip for processing the output signal of the pressure sensor 2, a wire bonding 5 connecting the pressure sensor 2 and the circuit board 4, and terminals 6 and 7 for outputting the signal from the circuit board 4 to the outside. The terminal 6 and a terminal stand 8, which supports the terminal 7, are secured to the flange member 3 by a joint member 11. Moreover, a gasket 9 and an O-ring 10 are assembled onto the flange member 3, as shown in FIG. 1 of JP-A-2002-168718, for example.

The pressure sensor device shown in FIG. 17 is composed of a transducer 12, a hexagon port 13, a cover 14, an annular sealing gasket 15, a periphery clip 16, a flexible circuit 17, and a base member 18 for outputting a signal to the outside. The transducer 12 is composed of a first conductive film, which deforms on receiving pressure, a second conductive film facing the first conductive film with a spacer held between the two conductive films, and a circuit for converting electrostatic capacitance varied by the deformation of the first conductive film to a voltage signal, as shown in FIG. 1 of JP-A-2002-202215, for example.

The pressure sensor device shown in FIG. 18 has an arrangement in which, in a sensor case 24, a pressure sensor chip 25 is connected to connecting leads 19, 20, 21, and 22. The connecting leads 19, 20, 21, and 22 are secured to the sensor case 24 while being insulated from one another by a hermetically sealing glass 23. Along with this, the pressure sensor chip 25 is encapsulated in silicon oil covered with a metallic diaphragm 26, as shown in FIGS. 8 and 10 of JP-A-2000-55762, for example. The pressure sensor device is protected by a metallic hardcover 27 at the upper side of the device.

The pressure sensor device shown in FIG. 19 has an arrangement in which the pressure sensor device shown in FIG. 18 is contained in a metallic housing 28 using an O-ring 29. In the metallic housing 28, a connector housing 33, having terminal boards 30, 31, and 32 electrically connected to the connecting leads 19, 20, 21, and 22, is incorporated together with an O-ring 34 and a spacer ring 35 for securing thereto. Securing is carried out by bending part of the metallic housing 28 and engaging the bent part with the connector housing 33. The metallic housing 28 has a pressure receiving port 36, a threaded section 37, a fastening section 38, and a stepped portion 39. See JP-A-2000-55762, for example.

Moreover, it is known, in a semiconductor pressure sensor, to use a semiconductor element, having a diaphragm section with a set of piezo-resistors formed thereon and an amplifying circuit of an output signal from the set of piezo-resistors. The amplifying circuit is formed by integrating a combination of an operational amplifier and a resistance network, including thin film resistors. In a pressure sensor device using the semiconductor pressure sensor, the semiconductor pressure sensor is contained in a sealed container. In the container, the space on the side to which the surface of the semiconductor sensor faces is kept in a constant pressure. Thus, an arrangement is provided in which, with the pressure in the container taken as a reference, pressure applied onto the back of the semiconductor pressure sensor is measured, as disclosed in JP-A-1-150832, for example.

In the pressure sensor device shown in FIG. 16 or FIG. 17, however, numerous parts raise the material cost and the assembly cost. Moreover, in each of the devices, the signal transmission path is made up of numerous parts, which require numerous connections. In the device shown in FIG. 16, the signal transmission path includes the pressure sensor 2, the wire bonding 5, the circuit board 4, the circuit chip, the terminal 6, and the terminal 7. While, in the device shown in FIG. 17, the path includes the transducer 12, the flexible circuit 17, the circuit chip, and the base member 18. This increases the failure probability, which results in long-term reliability issues. Furthermore, in the device shown in FIG. 16, the direct joint of the joint 1 and the pressure sensor 2 can cause stress, which is produced when screwing the joint 1, and transmit it to the pressure sensor 2. This lowers the accuracy and reliability of the measured signal.

Moreover, in the pressure sensor device shown in FIG. 18, external noises applied to the leads affect the silicon oil to polarize, which sometimes causes electric charges to accumulate on the surface of the pressure sensor chip 25. This can vary the signal output from the pressure sensor chip 25 and lower the reliability of the measured signal. Furthermore, an increase in an inner pressure due to expansion of the silicon oil under a high temperature environment and compression of the silicon oil when applying a high pressure produces repeated stresses in the metallic diaphragm 26. This fatigues the metallic diaphragm 26, which is becomes problematic with the long-term reliability. In addition, in the pressure sensor device shown in FIG. 19, the large area of the section for receiving pressure results in a large applied load to the device. For supporting such a load, rigidity of the metallic housing 28 must be increased. This increases the cost and upsizes the device.

Moreover, in the pressure sensor device disclosed in JP-A-1-150832, since the external signal terminals for outputting the output signals to the outside are glass-sealed at the bottom of the container, it can be supposed that the container is made of metal. However, the metal container has the disadvantage of being expensive. Furthermore, the external signal terminals and a pressure introducing port are provided on the same side. Therefore, when the pressure sensor device is used for such a purpose as to measure the pressure while mounted to an oil-enclosing block or an actuator block, the external signal terminals interrupt the pressure sensor device to make it difficult to mount the pressure sensor device on the oil-enclosing block or the like. Therefore, the external signal terminals must be projected on the side opposite to the side on which the pressure introducing port is provided. However, as explained above, when the container is metallic, it is difficult to provide the external terminals on the opposite side of the pressure introducing port.

There still remains a need for a pressure sensor device that can be manufactured with a low cost, have a high long-term reliability, and with measured signals of high accuracy and reliability, and in particular with external terminals disposed on the opposite side of the pressure introducing port. The present invention addresses this need.

SUMMARY OF THE INVENTION

The present invention relates to a pressure sensor cell and a pressure sensor device that incorporates the cell to measure pressure. The pressure sensor device according to the present invention can be particularly adapted for measuring pressure of 1 MPa or greater.

One aspect of the present invention is the pressure sensor cell, which can include a pressure sensor chip, a base member, a metallic pressure introducing unit, and a resin case. The chip can have a pressure receiving section for receiving pressure and a converting unit for converting strain of the pressure receiving section to an electric signal, the strain being exerted by pressure received by the pressure receiving section. The base member can have a first face, a second face, and a through hole extending through the first face and the second face. The metallic pressure introducing unit can have a first face, a second face, and a through hole extending through the first face and the second face. The resin case can have a signal terminal for outputting the electric signal from the converting unit of the pressure sensor chip.

According to the present invention, the pressure receiving section faces the through hole of the base member, and the pressure sensor chip is joined to the second face of the base member. Moreover, the through hole of the pressure introducing unit communicates with the through hole of the base member, and the second face of the pressure introducing unit is joined to the first face of the base member. The resin case can be bonded to the pressure introducing unit, and the pressure sensor chip and the signal terminal can be electrically connected by a wiring.

The second face of the pressure introducing unit can be bonded to the first face of the base member with an adhesive. Alternatively, the pressure sensor device can include a metallic material disposed between the pressure introducing unit and the base member, with the second face of the pressure introducing unit being joined to the first face of the base with the metallic material disposed therebetween. A metallic thin film can be included on the first face of the base member. The metallic thin film can be formed with three layers, including a chromium film, a platinum film, and a gold film.

The pressure introducing unit can be comprised of a metallic plate or pipe, and can be made of the 42 alloy, with at least one of nickel plating and gold plating. The pressure introducing unit can have a stepped portion protruding outwardly from the side thereof at a position midway from the first and second faces thereof, and wherein the stepped portion can be bonded to the resin case. Alternatively, the pressure introducing unit can protrudes outside more than an end face of the resin case at each end thereof in at least one direction. The pressure introducing unit can have a support on the outside more than an end face of the resin case at each end thereof in at least one direction, with the support being in contact with a different member that is integrated together with the pressure introducing unit.

The base member can be made of glass and the pressure sensor chip is joined to the glass base member by electrostatic bonding. Alternatively, the base member and the pressure sensor chip both can be made of silicon, and the pressure sensor chip can be joined to the base member with a sealing glass.

Another aspect of the present invention is the pressure sensor device, which includes the previously described pressure sensor cell and means for mounting the pressure sensor cell to an enclosure.

The mounting means can comprise a connector member and a joint member. The connector member can be provided with a disposing section for disposing the pressure sensor cell therein, and an output terminal integrally molded therewith, with one end of the output terminal electrically connected to the signal terminal of the pressure sensor cell and the other end of the output terminal projecting externally outwardly. The joint member can include a threaded section having a threaded portion and a through hole extending through the threaded portion, a containing section having a securing section for securing the connector member and containing the pressure sensor cell disposed in the connector member, and a sealing unit. The pressure sensor cell can be disposed in the connector member so that an opening of the through hole on the first face of the pressure introducing unit communicates with a pressure-transmitting medium from the enclosure. The signal terminal of the pressure sensor cell is electrically connected to the output terminal. The connector member and the joint member are joined with the pressure sensor cell disposed between the connector member and the joint member so that the through hole of the threaded section communicates with the through hole of the pressure introducing unit. The sealing unit seals the space between the pressure introducing unit and the joint member.

Alternatively, the mounting means can include a fixture for holding the sensor cell in a recess formed in the enclosure. The fixture can have an opening through which the signal terminal can extend externally outwardly, and can be mounted to the enclosure with fasteners.

Alternatively, the mounting means can include a tab for holding the sensor cell in a recess formed in the enclosure. As above, the tab having an opening through which the signal terminal can extend externally outwardly.

DETAILED DESCRIPTION

In the following, different embodiments of the pressure sensor cell and device according to the present invention are explained in detail with reference to the attached drawings. In this respect, similar or same elements refer to the same reference.

Figure 1:
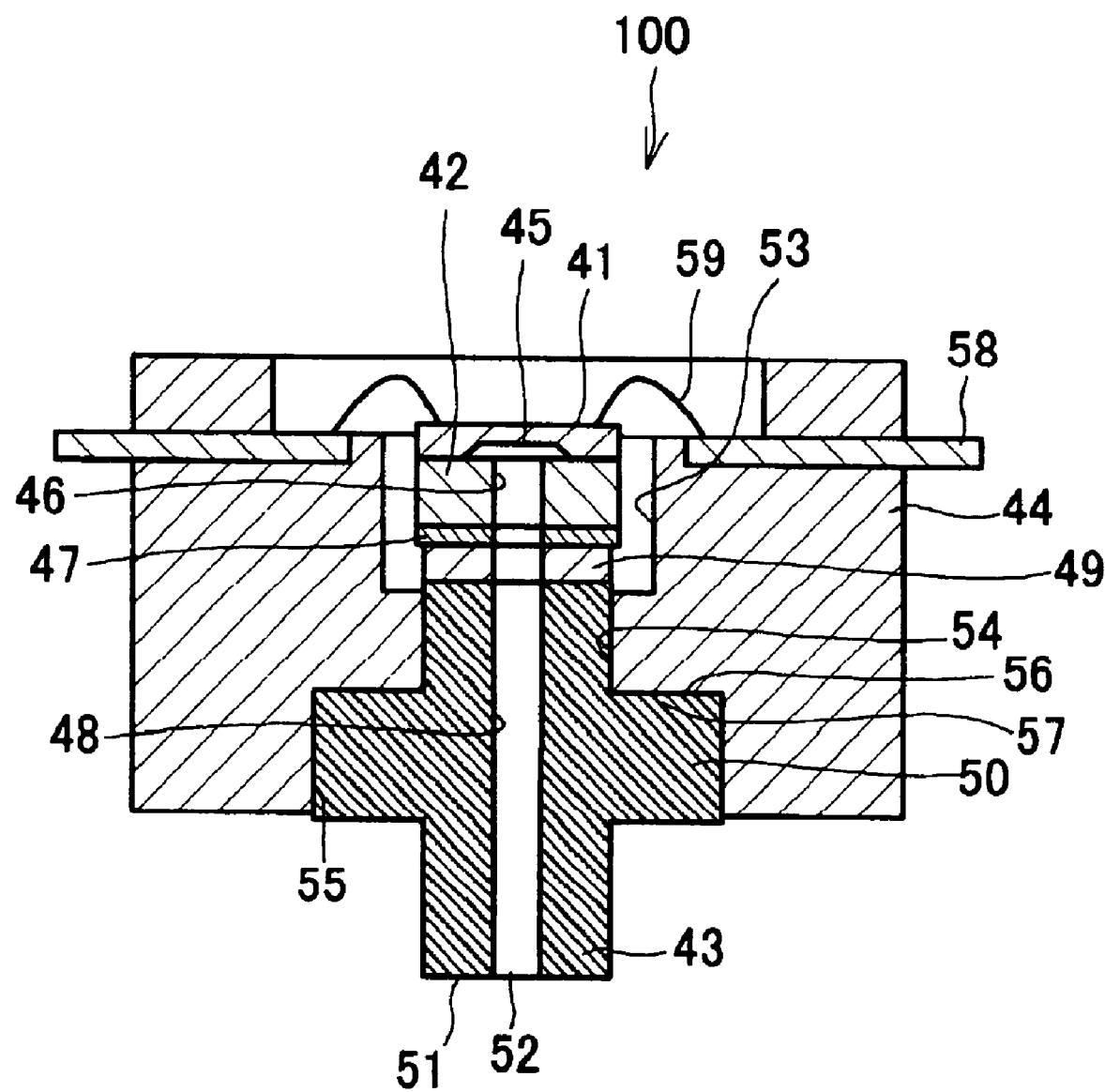
FIG. 1 illustrates a cross section of a first embodiment of a pressure sensor cell according to the present invention.

FIG. 1 is a cross sectional view of a first embodiment of a pressure sensor cell according to the present invention. As shown in FIG. 1, the first embodiment pressure sensor cell 100 includes a pressure sensor chip 41, a base member 42, a pressure introducing unit 43, and a case 44, which can be made of resin. The pressure sensor chip 41 has a diaphragm 45, which is a pressure receiving section, formed by processing part of a first face (bottom face in the illustration) of semiconductor silicon, for example, by recessing or etching. Pressure is received by the diaphragm 45. In the area corresponding to the backside of the diaphragm 45, on a second face (upper face in the illustration) of the silicon semiconductor, at least four gauges (not shown) are formed, each of which can be made of a diffused resistor. These gauges, when the pressure is applied to the diaphragm 45, convert the strain on the second face of the semiconductor silicon to resistance values. The pressure sensor chip 41, however, can be made of semiconductor materials other than silicon. In the pressure sensor chip 41, although not shown, various circuits are formed, such as a Wheatstone bridge circuit formed with the gauges, a circuit for amplifying the output signal of the Wheatstone bridge circuit, a circuit for compensating sensitivity, a circuit for compensating an offset, and a circuit for compensating temperature characteristics of the sensitivity and the offset. Moreover, in the pressure sensor chip 41, other elements can be formed, such as a surge protecting element and a filter (not shown).

The base member 42, though not particularly restricted, can be made of, for example, glass material, namely PYREX glass or tempax glass. A through hole 46 for communicating a pressure-transmitting medium, such as air or oil, can be formed in the center of the base member 42. The base member 42 and the pressure sensor chip 41 can be joined by electrostatic bonding under the joining condition at 400° C. and 400V, with the diaphragm 45 facing the through hole 46. With the electrostatic bonding carried out in such a way, the pressure sensor chip 41 and the base member 42 can be joined so that a high air-tightness is maintained between them. This enables realization of a highly airtight structure.

On the face of the base member 42, a metallic thin film 47 is layered on the side of being joined to the pressure introducing unit, which can be formed of a metallic pipe member 43. The thin film 47 can be composed of three layers, namely a chromium film, a platinum film, and a gold film, in this order from the side of the base member 42. Chromium has an excellent adhesion property to glass material to maintain a good joint with the glass material and prevent the thin film 47 from prematurely separating from the glass material. Moreover, the platinum film isolates the chromium film and the gold film so that they do not come into contact with, i.e., migrate toward, each other. Furthermore, the gold film is suited for the joining of the base member 42 and the metallic pipe member 43, with gold/tin eutectic solder or high temperature solder intervening between them.

The metallic pipe member 43, though not particularly restricted, can be made of, for example, 42 alloy, with a plating. The plating can be one or combination of nickel and gold plating. In the center of the metallic pipe member 43, a through hole 48 is provided for communicating a pressure-transmitting medium, such as air or oil therein. The metallic pipe member 43 and the base member 42, with the respective through holes 48 and 46 thereof positioned to communicate with each other, are joined together with metallic material 49, such as the gold/tin eutectic solder or the high temperature solder.

The reason for plating the metallic pipe member 43 is to increase the joining strength with the base member 42. The reason for using solder such as the gold/tin eutectic solder or the high temperature solder as the metallic material 49 is to enable the pressure sensor cell 100 to withstand service under high temperatures. Another reason is that low Young's modulus of these kinds of solder can reduce stress created in each of the base member 42 and the metallic pipe member 43 due to the difference in coefficient of thermal expansion between them. Here, the coefficients of thermal expansion of chromium, platinum, and gold are $4.5 \times 10^{-6}/°C.$, $9 \times 10^{-6}/°C.$ and $14.3 \times 10^{-6}/°C.$, respectively, whereas, the coefficients of thermal expansion of the glass material of the base member 42 is $3.2 \times 10^{-6}/°C.$ and the coefficient of thermal expansion of the 42 alloy material of the metallic pipe member 43 is $4.3 \times 10^{-6}/°C.$ The metallic pipe member 43 can include a stepped portion 50 protruding outwardly at a position substantially midway from the end, on the side joining to the base member 42 to the other end, namely the end on the side of an open end 51 from which the through hole 48 of the metallic pipe member 43 opens. The opening of the through hole 48 at the open end 51 of the metallic pipe member 43 is referred to as a pressure introducing port 52.

The resin case 44 has a recess 53 on the side of one end thereof. The pressure sensor chip 41 and the base member 42 are positioned or contained in the recess. In the bottom of the recess 53, a through hole 54 is provided, which penetrates through from the bottom to the opposite end of the resin case 44. Part of the metallic pipe member 43 is contained or positioned in the hole 54. On the end of the resin case 44 opposite to the recess 53, another recess 55 is formed. The recess 55 is stepped to complement the stepped portion 50 of the metallic pipe member 43. With the stepped portion 50 being contained in the recess 55, the face 56 of the stepped portion 50 on the opposite side of the pressure introducing port 52 is bonded to the face 57 of the recess 55 contacting the face 56.

With the faces 56 and 57 bonded, when pressure is applied to the pressure sensor cell 100 by the pressure-transmitting medium introduced from the pressure introducing port 52, the pressure acts on the stepped portion 50 of the metallic pipe member 43 to press the stepped portion 50 against the resin case 44. This provides a high structural reliability under an applied pressure. Moreover, the resin case 44 has a signal terminal 58 for outputting a signal to the outside. The base end of the signal terminal 58 is exposed at the side of the recess 53. The exposed portion of the signal terminal 58 and the pressure sensor chip 41 are electrically connected by wire bonding 59.

In the pressure sensor cell 100 with the above-explained arrangement, the pressure-transmitting medium is introduced from the pressure introducing port 52. The pressure received by the diaphragm 45 of the pressure sensor chip 41 deforms the diaphragm 45, which changes the resistance values of the gauges on the diaphragm 45 and outputs a voltage signal corresponding to the strain applied to the gauges. The voltage signal is amplified by an amplifying circuit, adjusted by adjusting circuits, such as the sensitivity compensating circuit, the offset compensating circuit, and the temperature characteristics compensating circuit, and thereafter output from the pressure sensor chip 41. The output signal is then output to the signal terminal 58 through the wire bonding 59.

At this time, the pressure-transmitting medium is only in contact with the inner wall of the metallic pipe member 43, the inner wall of the base member 42, and the diaphragm 45 of the pressure sensor chip 41. Therefore, the pressure-transmitting medium, whether in gaseous form of an air conditioning medium, such as R134a gas or $CO_2$ gas, or in liquid form, such as oil or lubricant, causes no degradation of the pressure sensor cell 100. This enables the pressure sensor cell 100 to obtain a high reliability for a long time. Moreover, even when a high pressure is measured, an area for receiving the pressure is limited only to the area of the diaphragm 45. Therefore, it becomes possible to make the pressure sensor device using the pressure sensor cell 100 have a smaller structure with a smaller size, to make it lightweight. This enables realization of a pressure sensor device with a reduced cost.

Specifically, the pressure to be measured and the diameter of the diaphragm 45 are taken as 20 MPa and 1 mm, respectively, for example. In this case, the pressure receiving area is 0.78 mm$^2$, from which the load received by the pressure sensor cell 100 is calculated as 20 MPa×0.78 mm$^2$. Letting the area of the face 57 of the recess 55 in the resin case 44, namely the face 57 (hereinafter a bottom face support) against which the stepped portion 50 of the metallic pipe member 43 is pressed against by the pressure, be 14.9 mm$^2$, the compressive force created at the bottom face support of the resin case 44 is calculated as 20 MPa×0.78 mm$^2$/14.9 mm$^2$, which is 1.05 MPa.

As resin material generally used for such a purpose, namely for the resin case 44, can be epoxy resin, polyphenylene sulfide (PPS) resin, polybutylene terephthalate (PBT) resin, or nylon resin. The breaking stresses of such kinds of resin are at levels of 98 to 196 MPa. Therefore, even with the compressive stress of the order of 1.05 MPa created at the bottom face support of the resin case 44, sufficient safety can be assured. This enables the pressure sensor cell 100 to obtain a high reliability for a long time.

In addition, the number of connections in a signal transmission path until a signal is output outside can be kept to a minimum to significantly lower the failure probability. Moreover, silicon can be also used for the material of the base member 42. In this case, the pressure sensor chip 41 and the base member 42 can be joined by using a sealing glass. This way, the thermal stress created in the pressure sensor chip 41 due to the difference in coefficient of thermal expansion between the pressure sensor chip 41 and the metallic pipe member 43 is reduced by the presence of the base member 42.

Figure 2:
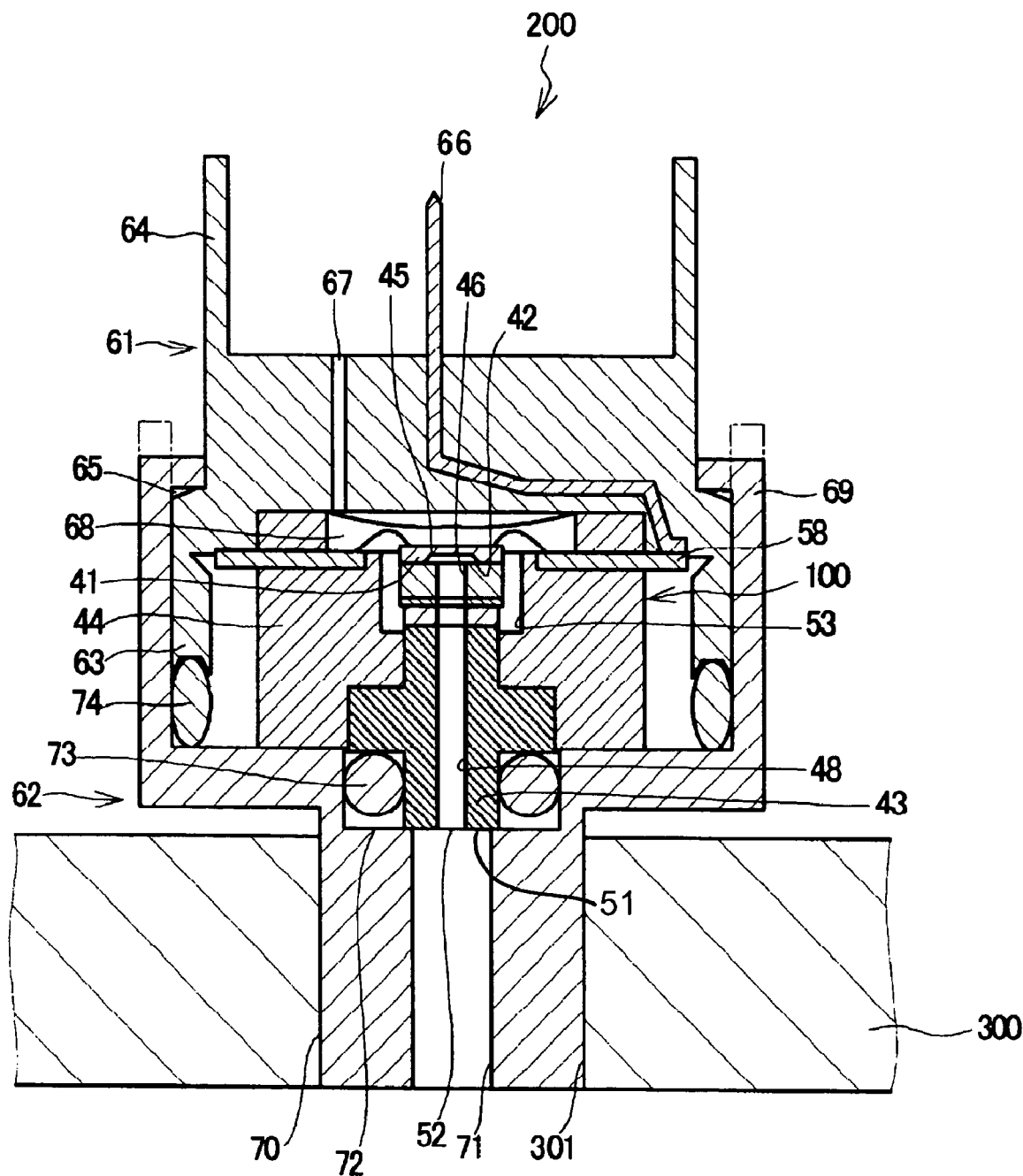
FIG. 2 illustrates a cross section of a first embodiment of a pressure sensor device, which incorporates the pressure sensor cell of FIG. 1, according to the present invention.

FIG. 2 is a cross sectional view showing a first embodiment of a pressure sensor device 200 according to the present invention. The pressure sensor device 200 incorporates the pressure sensor cell 100 of FIG. 1, and is mountable to an enclosure 300 with a mounting means. The mounting means can include a connector member 61 and a joint member 62. The end of the joint member 62 is then bent over around the connector member 61 to engage the connector member and integrate the pressure sensor cell 100, the connector member 61, and the joint member 62.

The connector member 61 can include a housing section 63 for containing the pressure sensor cell 100 and a socket section 64 for connecting the output of the pressure sensor device 200. The socket section 64 has an outer diameter smaller than that of the housing section 63 so that a stepped portion 65 is formed between the housing section 63 and the socket section 64. A signal output terminal 66 can be embedded in the connector member 61, between the housing section 63 and the socket section 64. One end of the output terminal 66 is exposed in the housing section 63 and the other end thereof is exposed in the socket section 64.

The connector member 61 can have a partition between the housing section 63 and the socket section 64. To an end face (a disposing section) of the partition exposed in the housing section 63, an end face of the pressure sensor cell 100 is bonded on the opposite side of the open end 51. The bonding can be carried out by using an adhesive, such as a silicon adhesive or an epoxy adhesive. Thus, the connector member 61 and the pressure sensor cell 100 can be integrated together. With the pressure sensor cell 100 thus bonded to the connector member 61, reliability of the device under action of mechanical force, such as vibration or shock, is further increased. Moreover, the root of the output terminal 66 exposed in the housing section 63 can be electrically connected to the signal terminal 58 of the pressure sensor cell 100 by laser welding.

In the partition between the housing section 63 and the socket section 64, a through hole 67 is provided. The through hole 67 is provided for communicating the space in the recess 53 containing the pressure sensor chip 41 in the resin case 44 of the pressure sensor cell 100, with the ambient. Without the through hole 67, gas trapped in the recess 53, when the pressure sensor cell 100 is mounted on the connector member 61, contracts with the change in temperature or ambient pressure to affect the pressure reading. The presence of the through hole 67 thus allows any built up gas in the recess 53 to freely enter and exit the recess 53. Therefore, even though the gas in the recess 53 contracts with change in temperature and ambient pressure, no variation is caused in the characteristics of the pressure sensor. Moreover, in the example shown in FIG. 2, the recess 53 containing the pressure sensor chip 41 is filled with gel 68. The gel 68 is not always necessary. However, the gel 68 is effective for protecting the pressure sensor chip 41, so that it is desirable to fill the recess 53 with the gel 68.

The joint member 62 has an arrangement in which a containing section 69 and a threaded section 70 are integrally shaped. The containing section 69 has a securing section for securing the housing section 63 of the connector member 61 and contains the pressure sensor cell 100. The threaded section 70 protrudes outwardly the containing section 69 from the bottom of the containing section 69. In the center of the threaded section 70, there is provided a through hole 71 for communicating a pressure-transmitting medium, such as air or oil therein. The containing section 69 of the joint member 62 is placed over the housing section 63 of the connector member 61 in which the pressure sensor cell 100 is bonded. An end rim of the containing section 69 is then bent over along the stepped portion 65 around the connector member 61 by means of a tool or a machine to engage with the stepped portion 65. This allows the joint member 62 and the connector member 61 to be secured to each other. Securing can be carried out by a method other than engagement by bending, for example, by bonding. With the joint member 62 and the connector member 61 thus secured to each other, an arrangement is provided such that the pressure introducing port 52 of the pressure sensor cell 100 communicates with the through hole 71 in the threaded section 70.

The pressure sensor device 200 is mountable to the enclosure 300 enclosing the pressure-transmitting medium by screwing the threaded section 70 into a threaded hole 301 formed through the enclosure 300. With the pressure sensor device 200 mounted to the enclosure 300, the through hole 71 of the threaded section 70 communicates with the space in the enclosure 300 in which the pressure-transmitting medium is enclosed. Therefore, the pressure-transmitting medium can be introduced to the diaphragm 45 of the pressure sensor chip 41 through the through hole 71 in the threaded section 70 and the respective through holes 48 and 46 of the metallic pipe member 43 and the base member 42 in the pressure sensor cell 100. The enclosure 300 can be, for example, an oil containing block of a transmission or an oil block of a hydraulic actuator.

At the bottom of the containing section 69, a recess 72 is formed. In the recess 72, the end of the metallic pipe member 43 on the side of the pressure introducing port 52 is accommodated. In the recess 72, an O-ring 73 is also accommodated, which is a sealing measure, for sealing the space between the metallic pipe member 43 and the joint member 62. The O-ring 73, in the recess 72 of the containing section 69, seals the space between at least the side face of the recess 72 and the side face of the metallic pipe member 43. The O-ring 73 prevents the pressure-transmitting medium, introduced to the metallic pipe member 43 through the through hole 71 in the threaded section 70, from flowing into sections other than the through hole 48 in the metallic pipe member 43. The space between the metallic pipe member 43 and the joint member 62 can be sealed with other sealing measures or means, such as projection welding or laser welding.

Furthermore, also in the space between the housing section 63 in the connector member 61 and the containing section 69 of the joint member 62, an O-ring 74 sealing the space is provided. The O-ring 74 prevents the pressure-transmitting medium from leaking to the outside when there is a failure, such as leakage of the pressure-transmitting medium from the metallic pipe member 43, breakage of the pressure sensor chip 41, and separation of the joined interface of the pressure sensor chip 41 and the base member 42.

Such a simple arrangement can reduce material cost and the assembly cost. Moreover, when the pressure sensor device 200 is screwed on the enclosure 300, the stress created in the threaded section 70 is applied to the pressure sensor chip 41 through the O-ring 73. Therefore, the applied stress is lessened by the O-ring 73 to make it possible to enhance accuracy and reliability of the measured signal. In addition, the output terminal 66 for outputting the signal to the outside is disposed on the opposite side to the opening for introducing the pressure-transmitting medium.

Figure 3:
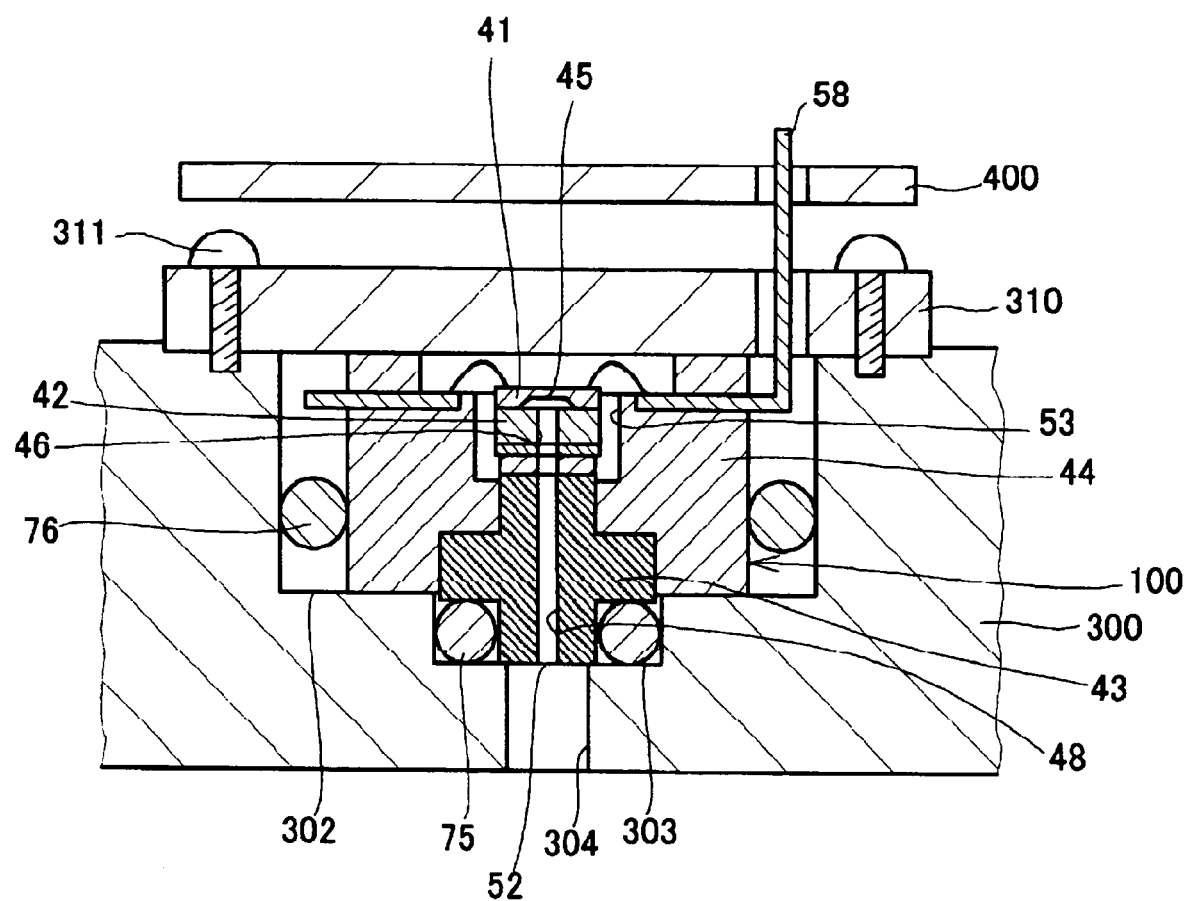
FIG. 3 illustrates a cross section of a second embodiment of a pressure sensor device, which incorporates the pressure sensor cell of FIG. 1, according to the present invention.

FIG. 3 is a cross sectional view showing a second embodiment of a pressure sensor device according to the present invention. The pressure sensor device includes the pressure sensor cell 100 mounted to the enclosure 300 with a mounting means, which includes a fixture 310 and fasteners 311, such as screws. Namely, in the enclosure 300, a first stepped recess 302 is provided for containing the pressure sensor cell 100. Moreover, the fixture 310 is set over the enclosure 300 and the pressure sensor cell 100 and secured to the enclosure 300 with the screws 311. The pressure sensor cell 100 is secured to the fixture 310 by the pressure applied to the pressure sensor cell 100 from the pressure introducing port 52 and reaction force applied from the fixture 310 against the pressure.

At the bottom of the first stepped recess 302, a second stepped recess 303 is formed. The second stepped recess 303 accommodates the end portion of the metallic pipe member 43, on the side of the pressure introducing port 52 of the metallic pipe member 43. At the bottom of the second step recess 303, a through hole 304 for communicating a pressure-transmitting medium, such as air or oil therein, is provided. The through hole 304 communicates with the through hole 48 of the metallic pipe member 43. Thus, the pressure-transmitting medium is introduced to the diaphragm 45 of the pressure sensor chip 41 through the through hole 304 in the enclosure 300, and the respective through holes 48 and 46 in the metallic pipe member 43 and the base member 42 in the pressure sensor cell 100.

In the second stepped recess 303, an O-ring 75 is also accommodated, which seals the space between the metallic pipe member 43 and the enclosure 300. The O-ring 75, in the second stepped recess 303, seals the space between at least the side face of the second stepped recess 303 and the side face of the metallic pipe member 43. The O-ring 75 prevents the pressure-transmitting medium, introduced to the metallic pipe member 43 through the through hole 304 in the enclosure 300, from flowing into sections other than the through hole 48 in the metallic pipe member 43. Moreover, in the first stepped recess 302, an O-ring 76 is also accommodated, which seals the space between the resin case 44 of the pressure sensor cell 100 and the enclosure 300. The O-ring 76 prevents the pressure-transmitting medium from leaking outside during a failure, such as leakage of the pressure-transmitting medium from the metallic pipe member 43, breakage of the pressure sensor chip 41, and separation of the joined interface of the pressure sensor chip 41 and the base member 42.

In the embodiment of FIG. 3, the signal terminal 58 of the pressure sensor cell 100 is bent and channeled to directly connect to a printed circuit board 400 positioned near the enclosure 300, by connection measures, such as soldering. The fixture 310 fully closes the first stepped recess 302 in the enclosure 300, but a through hole (not shown, as in the previous embodiment) is provided in the fixture 310 to communicate the space in the recess 53 containing the pressure sensor chip 41 in the resin case 44 of the pressure sensor cell 100 with the ambient. Alternatively, the fixture 310 can be configured to not fully close the recess 53 in the resin case 44, but to make part of the recess 53 open to the ambient. Furthermore, the recess 53 can be filled with gel.

Figure 4:
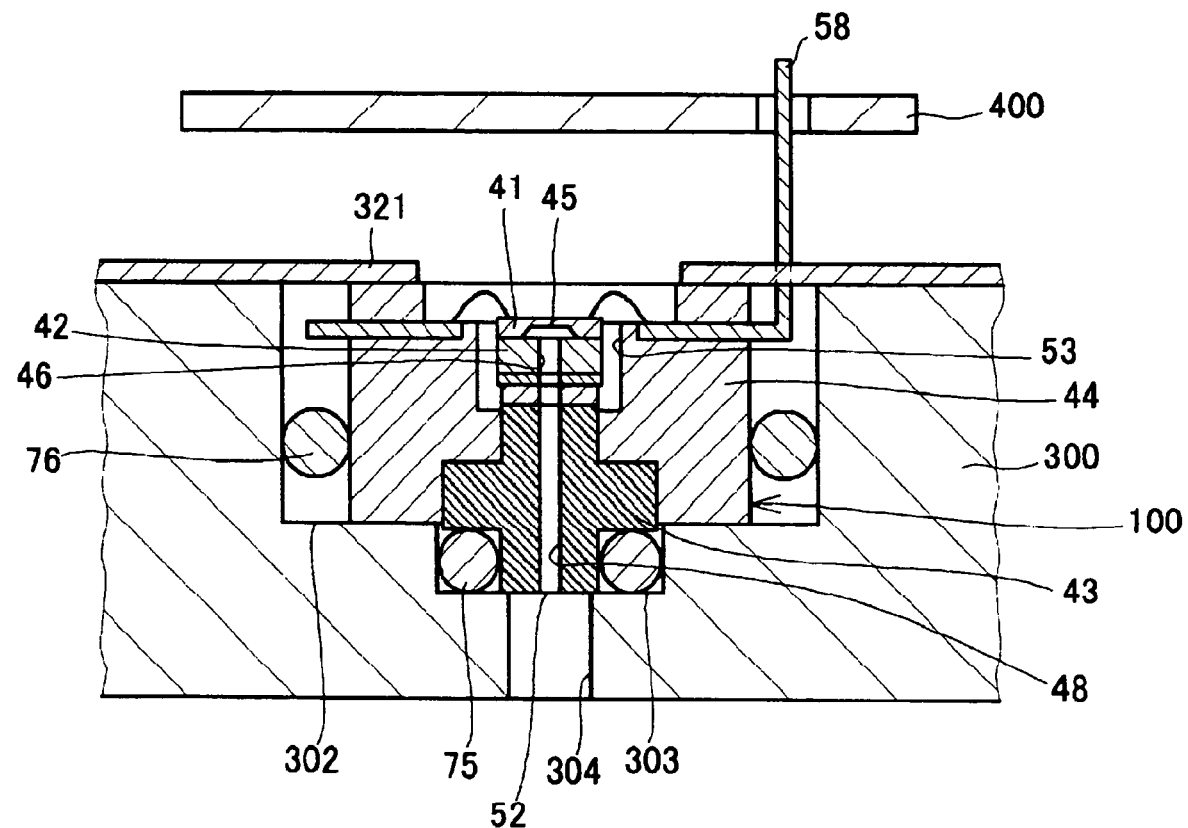
FIG. 4 illustrates a cross section of a third embodiment of a pressure sensor device, which incorporates the pressure sensor cell of FIG. 1, according to the present invention.

FIG. 4 is a cross sectional view of a third embodiment of a pressure sensor device according to the present invention. The embodiment of FIG. 4 is substantially similar to the embodiment of FIG. 3. In the embodiment of FIG. 4, however, instead of securing the pressure sensor cell 100 with the fixture 310 and the fasteners 311 in the embodiment of FIG. 3, the pressure sensor cell 100, which is contained in the first and second stepped recesses 302 and 303 in the enclosure 300, is secured with a different mounting means. Specifically, the mounting means here includes a tab 321, which stands or extends upwardly from the enclosure 300, bent over the pressure sensor cell with a machine or a tool, to engage the tab 321 to the resin case 44. Therefore, in the embodiment of FIG. 4, the fixture and fasteners, 310, 311 are eliminated to reduce the number of parts. Also, in the embodiment of FIG. 4, the O-ring 75 in the second stepped recess 303 in the enclosure 300 seals the space between at least the side face of the second stepped recess 303 and the side face of the metallic pipe member 43. The other arrangements are the same as those in the embodiment of FIG. 3.

Figure 5:
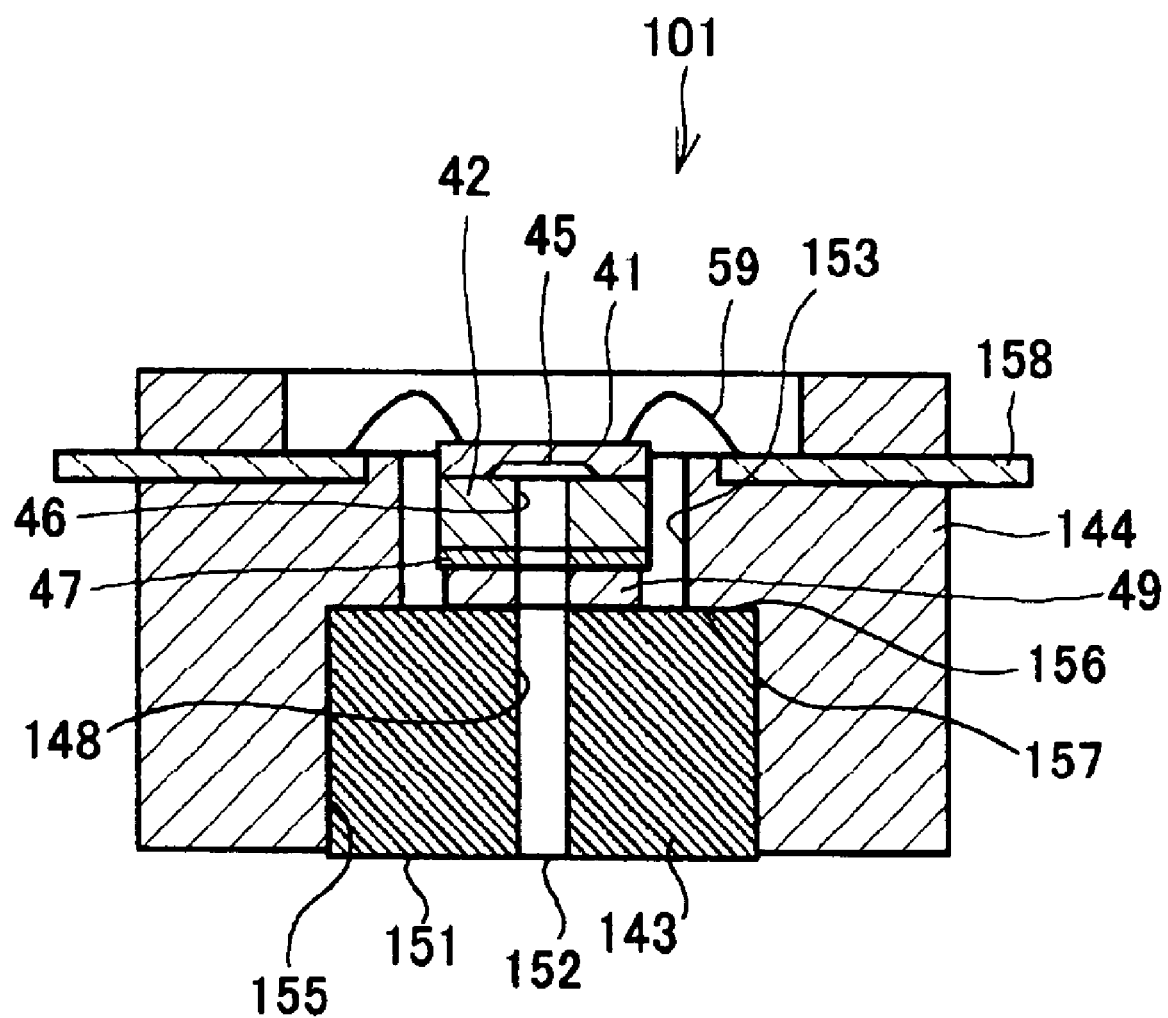
FIG. 5 illustrates a cross section of a second embodiment of a pressure sensor cell according to the present invention.

FIG. 5 is a cross sectional view showing a second embodiment of a pressure sensor cell according to the present invention. Here, the pressure sensor cell 101 is provided with a pressure sensor chip 41, a base member 42, a metallic plate member 143, and a resin case 144. Arrangements of the pressure sensor chip 41 and the base member 42 are the same as those in the embodiment of FIG. 1. The metallic plate member 143, though not particularly restricted, can be made of, for example, 42 alloy with a plating, which can one of or a combination of nickel and gold plating. In the center of the metallic plate member 143, a through hole 148 is provided for communicating a pressure-transmitting medium, such as air or oil therein. The metallic plate member 143 and the base member 42 are joined together with metallic material 49, such as the gold/tin eutectic solder or the high temperature solder, with the through hole 46 of the base member 42 and the through hole 148 of the metallic plate member 143 aligned to communicate with each other. The reason for plating the metallic plate member 143 is to increase the joining strength with the base member 42, as previously discussed with the first embodiment.

The resin case 144 has a first recess 153 on the side of one end thereof. The pressure sensor chip 41 and the base member 42 are positioned or contained in the first recess 153. On the opposite end of the resin case 144, opposite to the first recess 153, a second recess 155 having an opening area larger than that of the first recess 153 and communicating with the first recess 153 is formed. Namely, the first recess 153 and the second recess 155 forms a through hole section that penetrates through the resin case 144. In the second recess 155, the metallic plate member 143 is contained. An opening section of the through hole 148 at an open end 151 of the metallic plate member 143 is referred to as a pressure introducing port 152. A face 156 on the opposite side of the pressure introducing port 152 is bonded to a bottom face 157 of the second recess 155 facing and contacting the face 156.

With the faces 156 and 157 bonded, when the pressure is applied to the pressure sensor cell 101 by the pressure-transmitting medium introduced from the pressure introducing port 152, the pressure acts on the metallic plate member 143 and presses the metallic plate member 143 against the resin case 144. This provides a high structural reliability under an applied pressure. Moreover, the resin case 144 has a signal terminal 158 for outputting a signal to the outside. The base end of the signal terminal 158 is exposed at the side of the first recess 153. The exposed portion of the signal terminal 158 and the pressure sensor chip 41 are electrically connected by a wire bonding 59.

In the pressure sensor cell 101 with the above-explained arrangement, the pressure-transmitting medium is introduced from the pressure introducing port 152. The pressure received by the diaphragm 45 of the pressure sensor chip 41 deforms the diaphragm 45. This varies resistance values of the gauges on the diaphragm 45, by which a voltage signal corresponding to the variation is produced. The voltage signal is amplified by an amplifying circuit, adjusted by adjusting circuits, such as the sensitivity compensating circuit, the offset compensating circuit, and the temperature characteristics compensating circuit, and output from the pressure sensor chip 41, as previously disclosed. The output signal is then output to the signal terminal 158 through the wire bonding 59.

The pressure-transmitting medium is only in contact with the inner wall of the metallic plate member 143, the inner wall of the base member 42 and the diaphragm 45 of the pressure sensor chip 41. Therefore, the pressure-transmitting medium, whether in gaseous form, such as an air conditioning medium, or in liquid form, such as oil or lubricant, causes no degradation of the pressure sensor cell 101. This enables the pressure sensor cell 101 to obtain a high reliability for a long time. Moreover, even when a high pressure is measured, the area for receiving the pressure is limited only to the area of the diaphragm 45. Therefore, it becomes possible to make the pressure sensor device using the pressure sensor cell 101 have a smaller structure with a smaller size, and make it lighter. This enables realization of a pressure sensor device with a reduced cost.

Specifically, a pressure to be measured and the diameter of the diaphragm 45 are taken as 20 MPa and 1 mm, respectively, for example. In this case, the pressure receiving area is 0.78 mm$^2$, from which a load received by the pressure sensor cell 101 is calculated as 20 MPa×0.78 mm$^2$. Letting the area of the bottom face 157 of the second recess 155 in the resin case 144, namely a bottom face support against which the metallic plate member 143 is pressed by the pressure, be 14.9 mm$^2$, a compressive force created at the bottom face support of the resin case 144 is calculated as 20 MPa×0.78 mm$^2$/14.9 mm$^2$, namely 1.05 MPa.

Like in the embodiment of FIG. 1, the resin material used for the resin case 144 can be epoxy resin, polyphenylene sulfide (PPS) resin, polybutylene terephthalate (PBT) resin, or nylon resin. The breaking stresses of such kinds of resin are at levels of 98 to 196 MPa. Therefore, even with a compressive stress of the order of 1.05 MPa created at the bottom face support of the resin case 144, sufficient safety can be assured. This enables the pressure sensor cell 101 to obtain a high reliability for a long time.

In addition, like the embodiment of FIG. 1, the number of connections in the signal transmission path to the outside can be kept to a minimum to significantly lower a failure probability. Moreover, when silicon is used for the material of the base member 42, and the pressure sensor chip 41 and the base member 42 are joined by using a sealing glass, the thermal stress created in the pressure sensor chip 41 due to the difference in coefficient of thermal expansion between the pressure sensor chip 41 and the metallic plate member 143 is reduced by the presence of the base member 42. Thus, it is made possible to reduce the thermal stress due to the junction with the metallic plate member 143. In addition, the use of the metallic plate member 143 substituted for the metallic pipe member 43 of the embodiment of FIG. 1 can further reduce the material cost.

Figure 6:
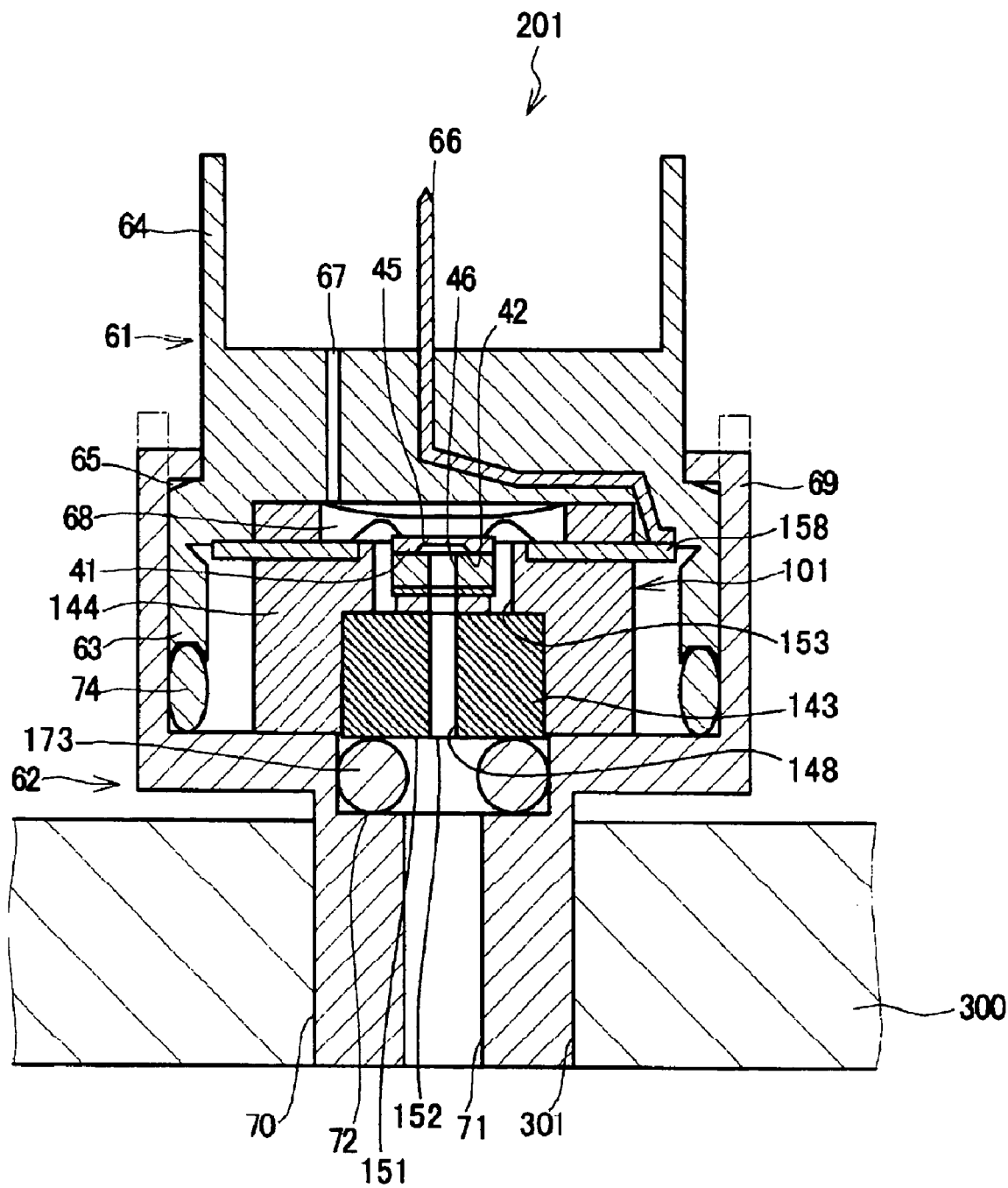
FIG. 6 illustrates a cross section of a fourth embodiment of a pressure sensor device, which incorporates the pressure sensor cell of FIG. 5, according to the present invention.

FIG. 6 is a cross sectional view showing a fourth embodiment of a pressure sensor device according to the present invention. Here, the pressure sensor device 201, is similar to the embodiment of FIG. 2, but includes the pressure sensor cell 101 of FIG. 5 held between the connector member 61 and the joint member 62. An end of the joint member 62 is then bent over around the connector member 61 to engage the same to thereby integrate the pressure sensor cell 101, the connector member 61, and the joint member 62. The arrangements of the connector member 61 and the joint member 62 are otherwise the same as that of the embodiment of FIG. 2.

The end face of the pressure sensor cell 101 on the opposite side of the open end 151, where the pressure introducing port 152 is opened, can be bonded to the end face (a disposing section) of a partition between the housing section 63 and the socket section 64 in the connector member 61, which face is exposed in the housing section 63. The bonding is carried out by using an adhesive such as a silicon adhesive or an epoxy adhesive. Thus, the connector member 61 and the pressure sensor cell 101 are integrated together. With the pressure sensor cell 101 thus bonded to the connector member 61, reliability of the device under action of mechanical force, such as vibration or shock, is further increased. Moreover, the root of the output terminal 66 exposed in the housing section 63 can be electrically connected to the signal terminal 158 of the pressure sensor cell 101 by laser welding.

Moreover, in the embodiment of FIG. 6, the recess 153 containing the pressure sensor chip 41 can be filled with gel 68. The gel 68 is not always necessary, but is effective for protecting the pressure sensor chip 41. Accordingly, the recess 153 is preferably filled with the gel 68. In the pressure sensor device 201, a pressure-transmitting medium enclosed in the space in the enclosure 300 is introduced to the diaphragm 45 of the pressure sensor chip 41 through the through hole 71 in the threaded section 70 of the joint member 62 and the respective through holes 148 and 46 of the metallic plate member 143 and the base member 42 in the pressure sensor cell 101.

In the recess 72 formed in the bottom of a containing section 69 of the joint member 62, an O-ring 173, which is a sealing measure for sealing a space between the metallic plate member 143 and the joint member 62, is accommodated. The O-ring 173, in the recess 72 of the containing section 69, seals the space between at least the bottom face of the recess 72 and the open end 151 of the metallic plate member 143. The O-ring 73 prevents the pressure-transmitting medium, introduced to the metallic plate member 143 through the through hole 71 in the threaded section 70, from flowing into sections other than the through hole 148 in the metallic plate member 143.

According to the embodiment of FIG. 6, such a simple arrangement can reduce the material cost and the assembly cost. Moreover, when the pressure sensor device 201 is mounted (screwed in) to the enclosure 300, the stress created in the threaded section 70 is applied to the pressure sensor chip 41 through the O-ring 173. Therefore, the applied stress is lessened by the O-ring 173 to make it possible to enhance accuracy and reliability of the measured signal. In addition, the output terminal 66 for outputting a signal to the outside is disposed on the opposite side to the opening for introducing the pressure-transmitting medium.

Furthermore, in the embodiment of FIG. 6, the magnitude of the load acting on the pressure sensor cell 101 by the pressure-transmitting medium is determined by a first area in a form given by a line of contact between the open end 151 of the metallic plate member 143 and the O-ring 173. Compared with this, in the embodiment of FIG. 2, the magnitude of the load acting on the pressure sensor cell 100 by the pressure-transmitting medium is determined by a second area, which is larger than the first area, in a form given by a line of contact between the side face of the recess 72 in the joint member 62 and the O-ring 73. Since the first area is smaller than the second area, the magnitude of the load acting on the pressure sensor cell 101 becomes smaller than the magnitude of the load in the embodiment of FIG. 2. Therefore, the pressure sensor device 201 of the embodiment of FIG. 6 is suited for measuring a higher pressure than the pressure sensor device 200 of the embodiment of FIG. 2.

Figure 7:
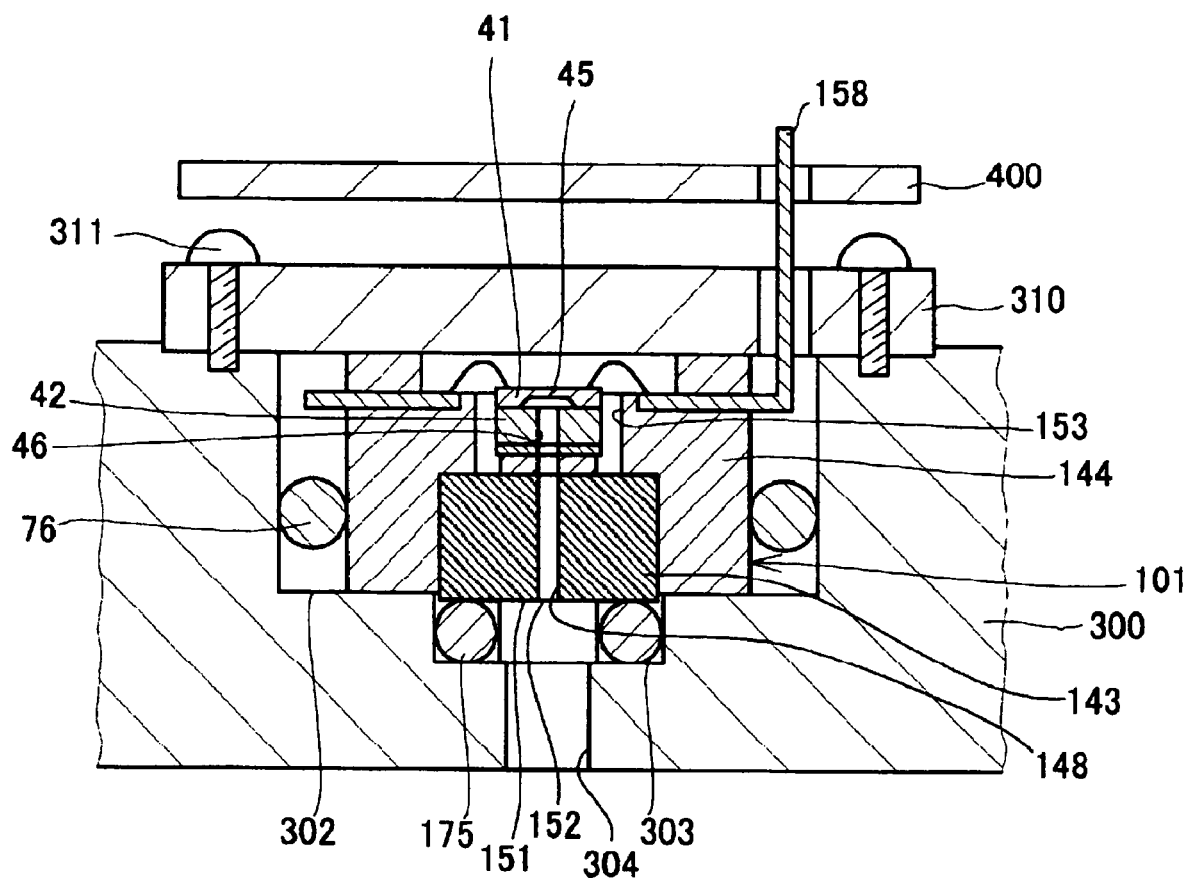
FIG. 7 illustrates a cross section of a fifth embodiment of a pressure sensor device, which incorporates the pressure sensor cell of FIG. 5, according to the present invention.

FIG. 7 is a cross sectional view showing a fifth embodiment of a pressure sensor device according to the present invention. Here, the pressure sensor device is similar to the embodiment of FIG. 3, but includes the pressure sensor cell 101 of the embodiment of FIG. 5 contained in the first stepped recess 302 formed in the enclosure 300, over which the fixture 310 is secured to the enclosure 300 with fasteners 311. The pressure sensor cell 101 is secured by pressure applied from the pressure introducing port 152 and reaction force applied from the fixture 310 against the pressure, as previously disclosed.

The second stepped recess 303 formed in the bottom of the first stepped recess 302 accommodates an O-ring 175, which seals the space between the metallic plate member 143 and the enclosure 300. The O-ring 175 in the second stepped recess 303 seals the space between at least the bottom face of the second stepped recess 303 and the open end 151 of the metallic plate member 143. The O-ring 175 prevents the pressure-transmitting medium, introduced to the metallic plate member 143 through the through hole 304 in the enclosure 300, from flowing into sections other than the through hole 148 in the metallic plate member 143. Moreover, the signal terminal 158 of the pressure sensor cell 101 is bent and channeled to directly connect to a printed circuit board 400 positioned near the enclosure 300 by connection measures, such as soldering.

Figure 8:
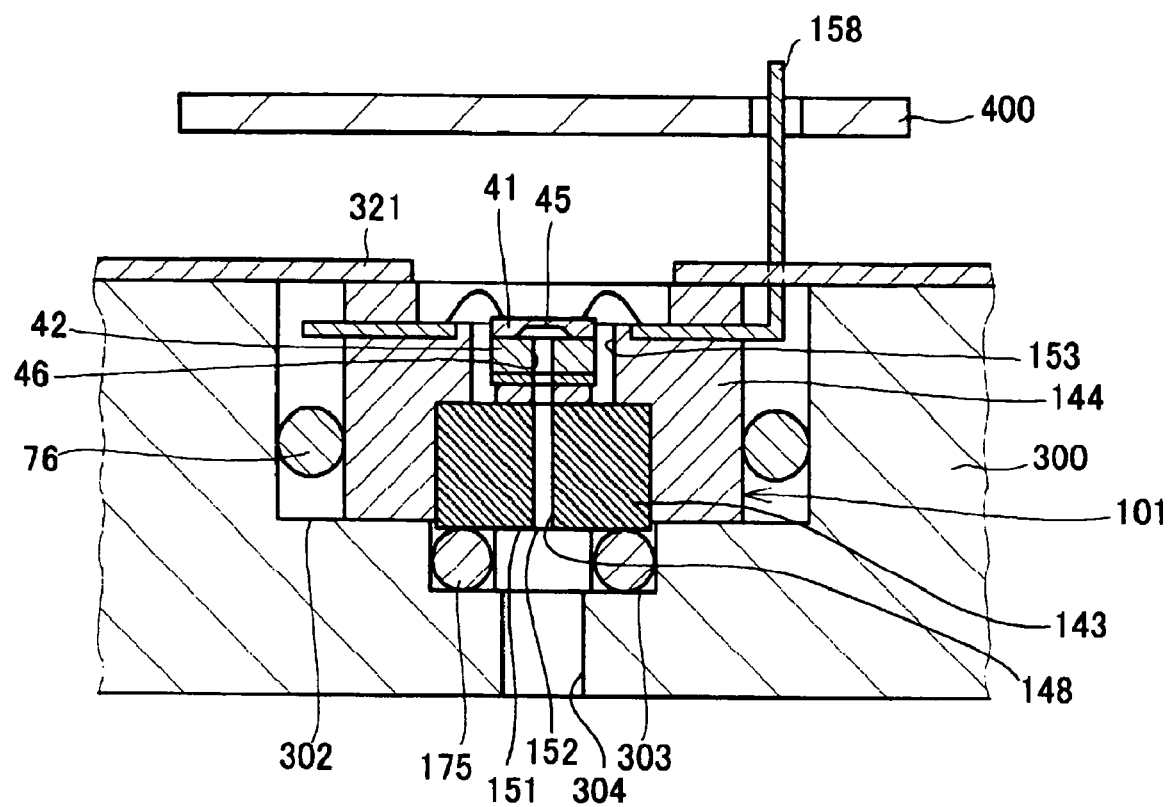
FIG. 8 illustrates a cross section of a sixth embodiment of a pressure sensor device, which incorporates the pressure sensor cell of FIG. 5, according to the present invention.

FIG. 8 is a cross sectional view showing a sixth embodiment of a pressure sensor device according to the present invention. Here, the pressure sensor device is similar to the embodiment of FIG. 4, but includes the pressure sensor cell 101 of the embodiment of FIG. 5. Here, instead of securing the pressure sensor cell 101 by using the fixture and fasteners 310, 311 as in the embodiment of FIG. 7, the pressure sensor cell 101 contained in the first and second stepped recesses 302 and 303 in the enclosure 300 is secured by bending the tab 321 extending from the enclosure 300 with a machine or a tool to make the tab 321 engage the resin case 144 of the pressure sensor cell 101. As the fixture and fasteners 310, 311 are eliminated, the number of parts can be reduced more than the embodiment of FIG. 7. Also, the O-ring 175 in the second stepped recess 303 in the enclosure 300 seals the space between at least the bottom face of the second step recess 303 and the open end 151 of the metallic plate member 143. The other arrangements are the same as those in the embodiment of FIG. 7.

Figure 9:
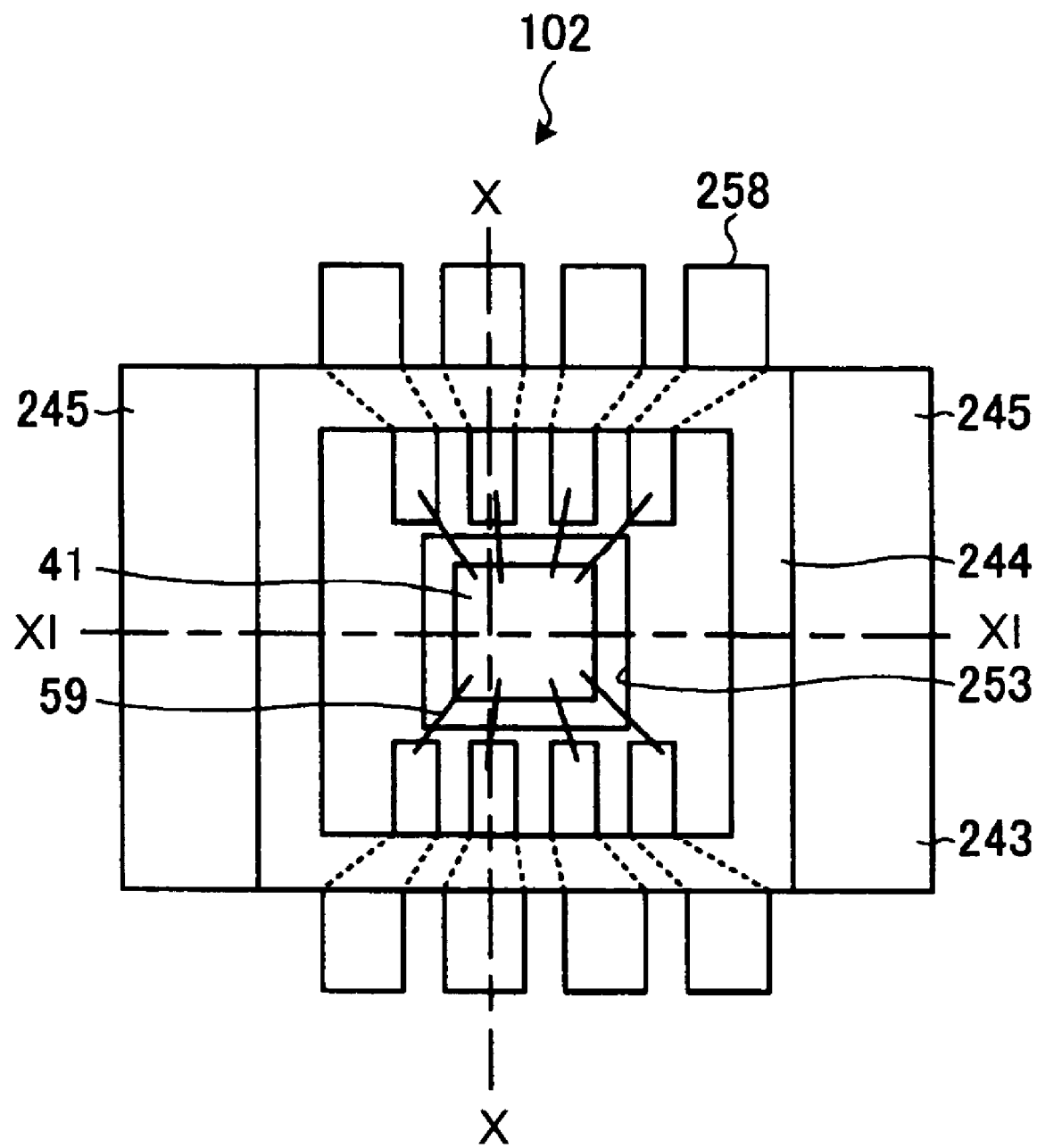
FIG. 9 illustrates a plan view of third embodiment of a pressure sensor cell according to the present invention.
Figure 10:
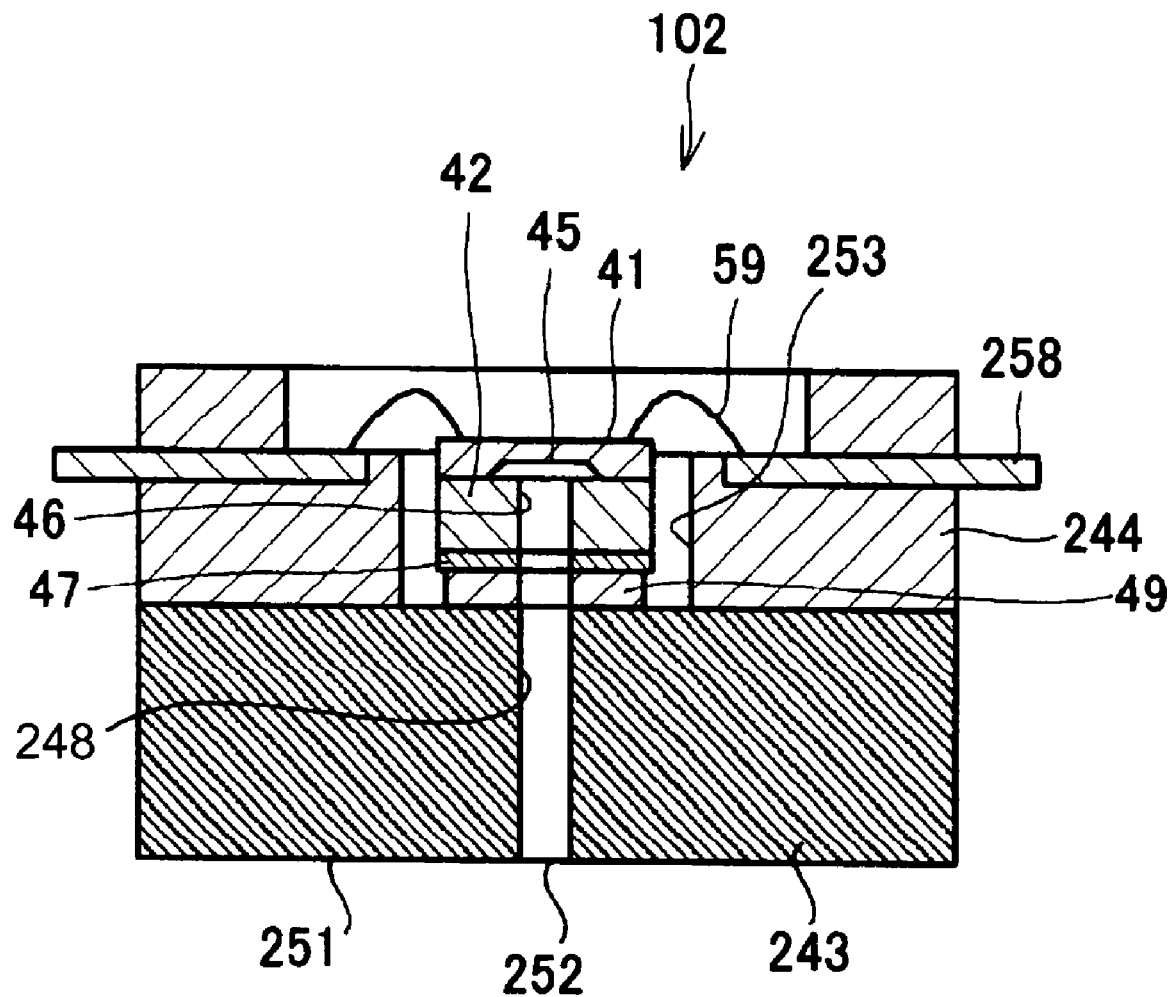
FIG. 10 illustrates a cross section taken along line X-X of FIG. 9.
Figure 11:
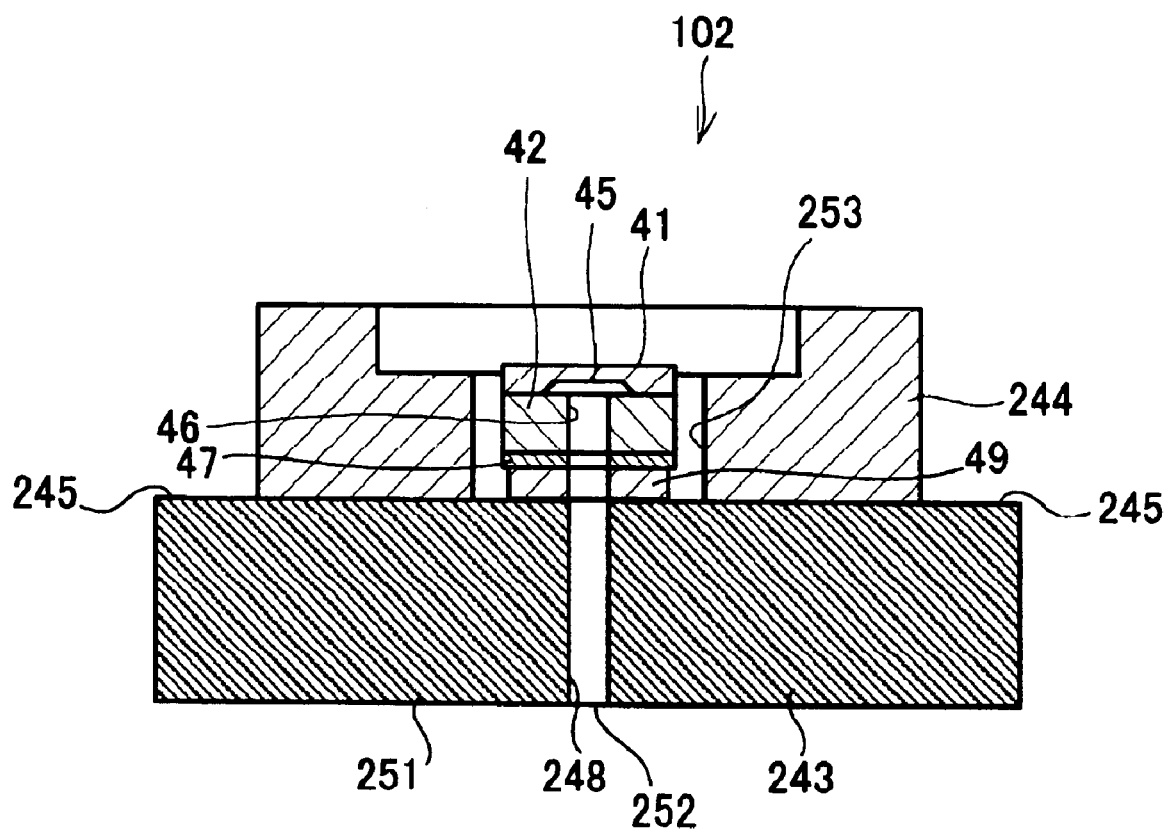
FIG. 11 illustrates a cross section taken along line XI-XI of FIG. 9.

FIG. 9 is a plan view showing a third embodiment of a pressure sensor cell according to the present invention. FIGS. 10 and 11 are cross sectional views of FIG. 9 taken along the line X-X and XI-XI of FIG. 9, respectively. As shown in these figures, the pressure sensor cell 102 is provided with the pressure sensor chip 41, the base member 42, a metallic plate member 243, and a resin case 244. The arrangement of the pressure sensor chip 41 and the base member 42 is the same as that of the embodiment of FIG. 1.

The resin case 244 has, though not particularly restricted, a rectangular plane figure with, for example, four signal terminals 258 projecting from each of a pair of opposing sides. The signal terminals 258 aligned on the one side of the resin case 244 are external connection terminals for outputting the signals of the pressure sensor cell 102. The signal terminals 258 aligned on the other side of the resin case 244 are internal adjustment terminals used when adjusting characteristics of the pressure sensor cell 102 and can be shorter than the external connection terminals. Moreover, the resin case 244 has a recess 253. The pressure sensor chip 41 and the base member 42 are contained in the recess 253 while exposing the base ends of the signal terminals 258. The exposed portions of the signal terminals 258 and the pressure sensor chip 41 are electrically connected by a wire bonding 59. The bottom face of the resin case 244 is bonded to a face on one side of the metallic plate member 243.

Referring to FIG. 11, the metallic plate member 243 protrudes outside from each end face of the resin case 244 where no projection of signal terminals 258. The portion of the metallic plate member 243 protruding outside from each end face of the resin case 244 becomes a support 245 with which a different member (such as a connector member 161 of the embodiment of FIGS. 12 and 13 that will be explained later) is made to contact for integrating together with the metallic plate member 243. Referring to FIG. 10, on each side with the signal terminals 258 projecting from the resin case 244, the signal terminals 258 project outside more than the end face of the metallic plate member 243.

The metallic plate member 243, though not particularly restricted, can be made of, for example, 42 alloy with a plating for increasing strength of joint with the base member 42. The plating can be one or a combination of nickel and gold plating. In the center of the metallic plate member 243, a through hole 248 is provided for communicating a pressure-transmitting medium, such as air or oil, therein. The base member 42 and the metallic plate member 243 are joined together with metallic material 49, such as the gold/tin eutectic solder or the high temperature solder, with the through hole 46 of the base member 42 and the through hole 248 of the metallic plate member 243 aligned to communicate with each other.

In the pressure sensor cell 102 with the above-explained arrangement, the pressure-transmitting medium is introduced through the through hole 248 from a pressure introducing port 152 at an open end 251 of the metallic plate member 243. A pressure received by the diaphragm 45 of the pressure sensor chip 41 deforms the diaphragm 45. This varies gauge resistance values of the gauges on the diaphragm 45, by which a voltage signal corresponding to the variation is produced. The voltage signal is amplified by an amplifying circuit, adjusted by adjusting circuits, such as the sensitivity compensating circuit, the offset compensating circuit, and the temperature characteristics compensating circuit, and output from the pressure sensor chip 41. The output signal is then output to the signal terminal 258 through the wire bonding 59.

The pressure-transmitting medium is only in contact with the inner wall of the metallic plate member 243, the inner wall of the base member 42, and the diaphragm 45 of the pressure sensor chip 41. Therefore, the pressure-transmitting medium, whether in gaseous form, such as an air conditioning medium, or in liquid form, such as oil or lubricant, causes no degradation of the pressure sensor cell 102. This enables the pressure sensor cell 102 to obtain a high reliability for a long time. Moreover, even when a high pressure is measured, the area for receiving the pressure is limited only to the area of the diaphragm 45. Therefore, it becomes possible to make the pressure sensor device using the pressure sensor cell 102 have a smaller structure with a smaller size and lightweight. This enables realization of a pressure sensor device with a reduced cost.

Specifically, when the resin case 244 is made of resin material such as epoxy resin, polyphenylene sulfide (PPS) resin, polybutylene terephthalate (PBT) resin, or nylon resin, like in the embodiment of FIG. 5, sufficient safety can be assured even with a compressive stress of the order of 1.05 MPa created in the resin case 244. This enables the pressure sensor cell 102 to obtain a high reliability for a long time.

In addition, like in the embodiment of FIG. 1, the number of connections in a signal transmission path until a signal is output to the outside can be kept to a minimum to significantly lower a failure probability. Moreover, when silicon is used for the material of the base member 42, and the pressure sensor chip 41 and the base member 42 are joined by using a sealing glass, the thermal stress created in the pressure sensor chip 41 due to the difference in coefficient of thermal expansion between the pressure sensor chip 41 and the metallic plate member 243 is reduced by the presence of the base member 42. Thus, it is made possible to reduce the thermal stress due to the junction with the metallic plate member 243. In addition, the use of the metallic plate member 243 substituted for the metallic pipe member 43 of the embodiment of FIG. 1 can further reduce the material cost.

Figure 12:
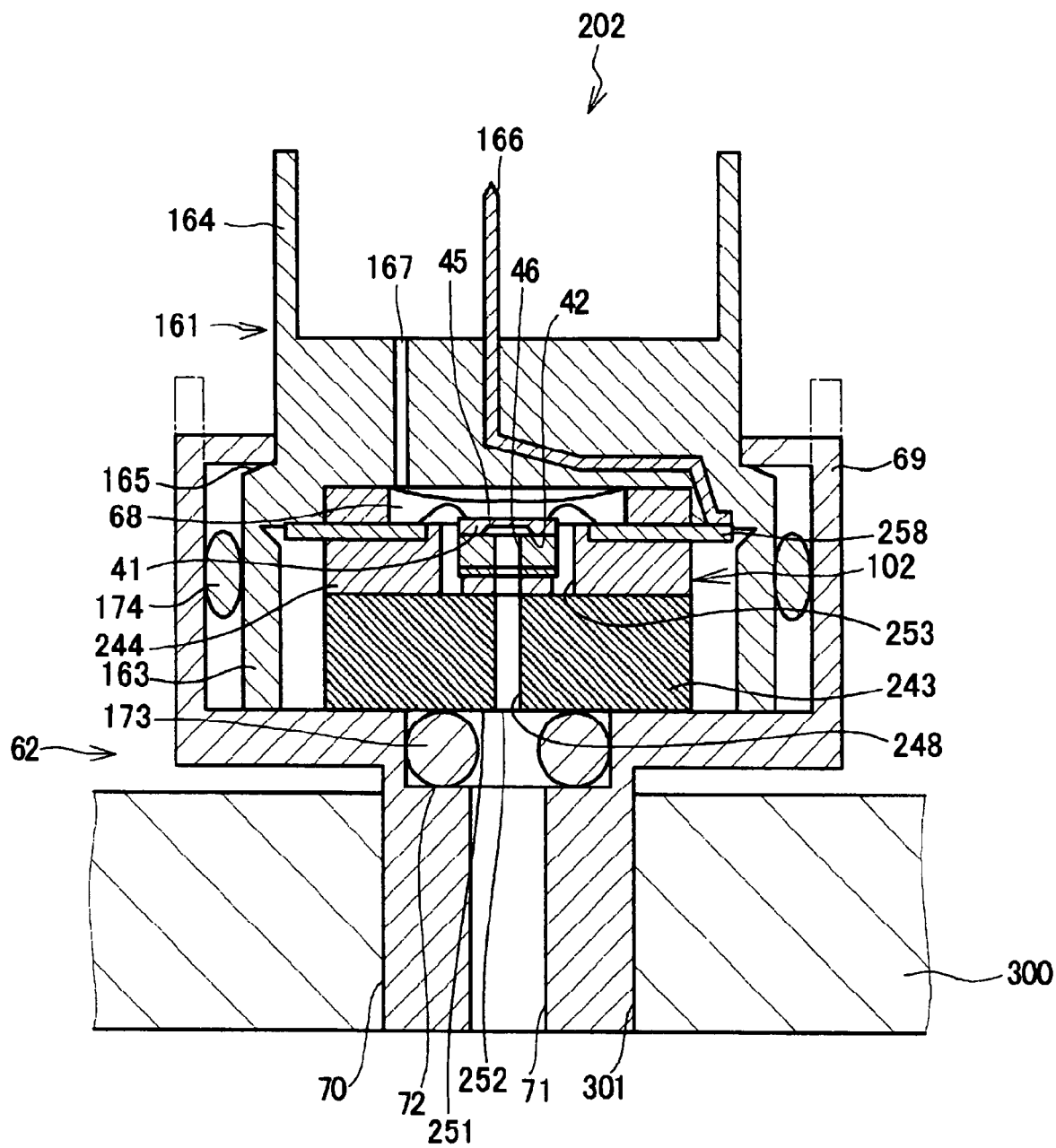
FIG. 12 illustrates a cross section view of a seventh embodiment of a pressure sensor device, which incorporates the pressure sensor cell of FIG. 9 (illustrating the cross section of FIG. 10), according to the present invention.
Figure 13:
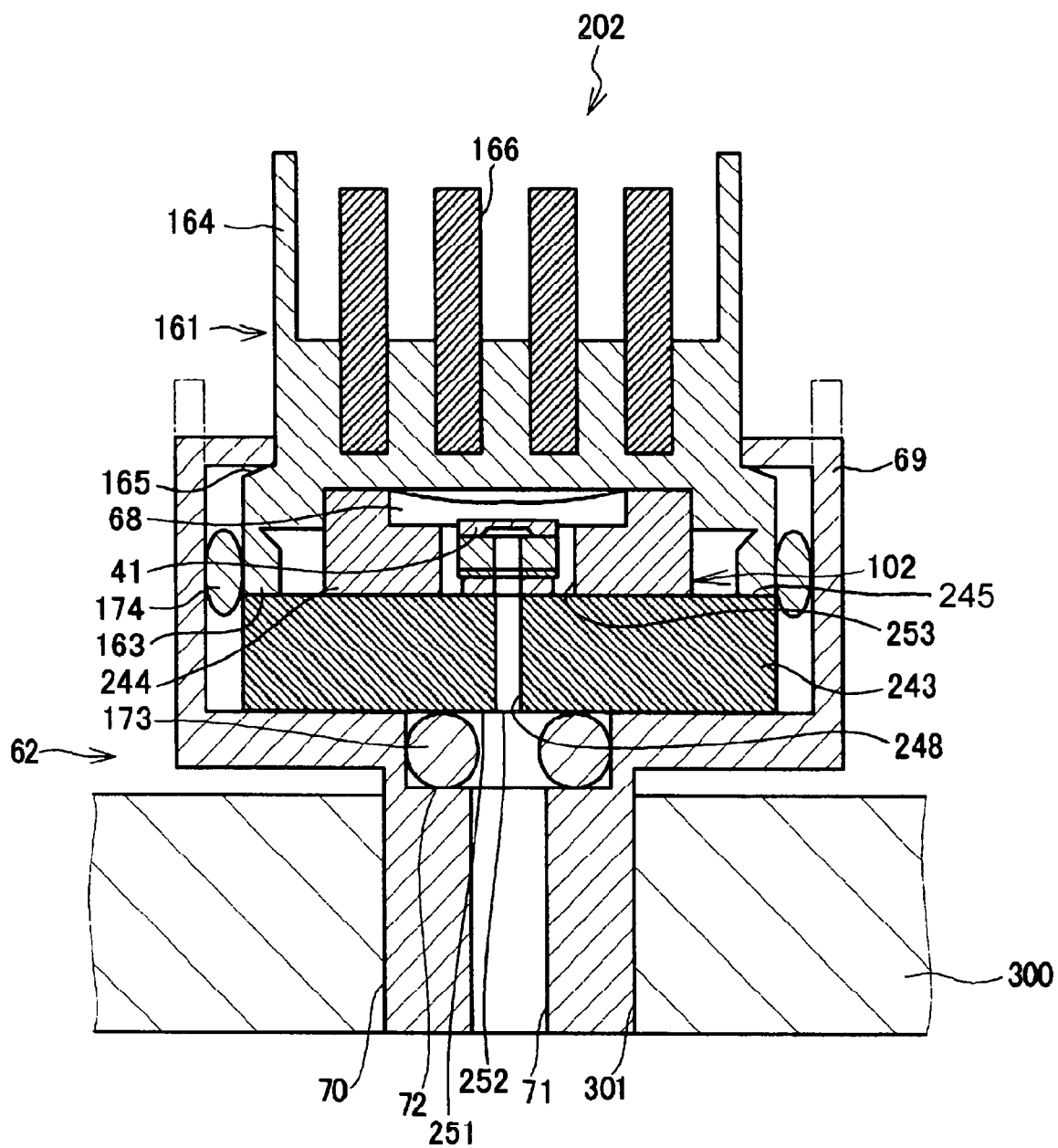
FIG. 13 illustrates a cross section of the pressure sensor device of FIG. 12, but illustrating the pressure sensor as shown in FIG. 11.

FIGS. 12 and 13 are cross sectional views of a seventh embodiment of a pressure sensor device 202 according to the present invention. Here, the pressure sensor device 202 is similar to the embodiment of FIG. 2, but includes the pressure sensor cell 102 of the embodiment of FIGS. 9-11 held between the connector member 161 and the joint member 62. An end of the joint member 62 is then bent over around the connector member 161 to engage the same to thereby integrate the pressure sensor cell 102, the connector member 161, and the joint member 62. The arrangement of the joint member 62 is the same as that of the embodiment of FIG. 2.

The connector member 161 has an arrangement in which a housing section 163 for containing the pressure sensor cell 102 and a socket section 164 for outputting the output of the pressure sensor device 202 are integrated together. The socket section 164 has an outer diameter smaller than that of the housing section 163 so that a stepped portion 165 is formed between the housing section 163 and the socket section 164. In a partition between the housing section 163 and the socket section 164, a signal output terminal 166 is embedded for outputting a signal to the outside. One end of the output terminal 166 is exposed in the housing section 163 and the other end thereof is exposed in the socket section 164.

The length of the bottom end of the housing section 163 from the partition on the side of the metallic plate member 243 with the projecting signal terminals 258 is different from the length on the side of the metallic plate member 243 without the projecting signal terminals 258. As shown in FIG. 12, on the side of the metallic plate member 243 with the projecting signal terminals 258, that is, on the side along the length of the metallic plate member 243, the bottom end of the housing section 163 comes into contact with the bottom face of the joint member 62. While, as shown in FIG. 13, on the side of the metallic plate member 243 without the projecting signal terminals 258, that is, on the side along the width of the metallic plate member 243, the bottom end of the housing section 163 comes into contact with the support 245 of the metal plate 243. This way, the connector member 161 is supported by the joint member 62 and the metallic plate member 243 to thereby prevent the resin case 244 from being subjected to an excessive load when a high pressure is measured.

An end face of the pressure sensor cell 102 on the opposite side of the open end 251 where the pressure introducing port 252 is opened is bonded to an end face (a disposing section) of a partition between the housing section 163 and the socket section 164 of the connector member 161, which end face is exposed in the housing section 163. The bonding is carried out by using an adhesive such as a silicon adhesive or an epoxy adhesive. Thus, the connector member 161 and the pressure sensor cell 102 are integrated together. With the pressure sensor cell 102 thus bonded to the connector member 161, the reliability of the device under action of mechanical force such as vibration or shock is further increased. Moreover, the root of the output terminal 166 exposed in the housing section 163 is electrically connected to the signal terminal 258 of the pressure sensor cell 102 by laser welding.

In the partition between the housing section 163 and the socket section 164, a through hole 167 is provided to communicate the space in the recess 253 containing the pressure sensor chip 41 in the resin case 244 of the pressure sensor cell 102 with the ambient. Moreover, the recess 253 can be filled with, for example, gel 68 for protecting the pressure sensor chip 41.

The joint member 62 has a securing section for securing the housing section 163 of the connector member 161. A containing section 69 of the joint member 62 is put over the housing section 163 of the connector member 161 in which the pressure sensor cell 102 is bonded. A top end rim of the containing section 69 is bent over along the stepped portion 165 around the connector member 161 by means of a tool or a machine to engage with the stepped portion 165. This allows the joint member 62 and the connector member 161 to be secured to each other. The securing can be carried out by a method other than bending, for example, by bonding.

In the pressure sensor device 202, a pressure-transmitting medium enclosed in a space in the enclosure 300 is introduced to the diaphragm 45 of the pressure sensor chip 41 through the through hole 71 in the threaded section 70 of the joint member 62 and the respective through holes 248 and 46 of the metallic plate member 243 and the base member 42 in the pressure sensor cell 102. Moreover, in the recess 72 formed in the bottom of the containing section 69 of the joint member 62, an O-ring 173, as a sealing measure, is accommodated. The O-ring 173, in the recess 72 of the containing section 69, seals the space between at least the bottom face of the recess 72 and the open end 251 of the metallic plate member 243. The O-ring 73 prevents the pressure-transmitting medium, introduced to the metallic plate member 243 through the through hole 71 in the threaded section 70, from flowing into sections other than the through hole 248 in the metallic plate member 243.

Furthermore, also in the space between the outer side face of the housing section 163 in the connector member 161 and the inner side face of the containing section 69 of the joint member 62, an O-ring 174 sealing the space is provided. The O-ring 174 prevents the pressure-transmitting medium from leaking outside at failures such as leakage of the pressure-transmitting medium from the metallic pipe member 143, breakage of the pressure sensor chip 41 and separation of the joined interface of the pressure sensor chip 41 and the base member 42.

According to the seventh embodiment, such a simple arrangement can reduce the material cost and the assembly cost. Moreover, when the pressure sensor device 202 is screwed to the enclosure 300, the stress created in the threaded section 70 is applied to the pressure sensor chip 41 through the O-ring 173. Therefore, the applied stress is lessened by the O-ring 173 to make it possible to enhance accuracy and reliability of a measured signal. In addition, the output terminal 166 for outputting a signal to the outside is disposed on the opposite side to the opening for introducing the pressure-transmitting medium.

Furthermore, the magnitude of the load acting on the pressure sensor cell 102 by the pressure-transmitting medium is determined by a third area in a form given by a line of contact between the open end 251 of the metallic plate member 243 and the O-ring 173. Compared with this, in the embodiment of FIG. 2, the magnitude of the load acting on the pressure sensor cell 100 is determined by the second area, as previously explained. Since the third area is smaller than the second area, the magnitude of the load acting on the pressure sensor cell 102 becomes smaller than the magnitude of the load in the embodiment of FIG. 2. Therefore, the pressure sensor device 202 is suited for measuring a higher pressure than the pressure sensor device 200 of FIG. 2. Moreover, the arrangement in the embodiment of FIGS. 12 and 13 is such that no excessive load is applied to the resin case 244 as explained above, and is thus suited for measuring a higher pressure than the pressure sensor device 201 of the embodiment of FIG. 6.

Figure 14:
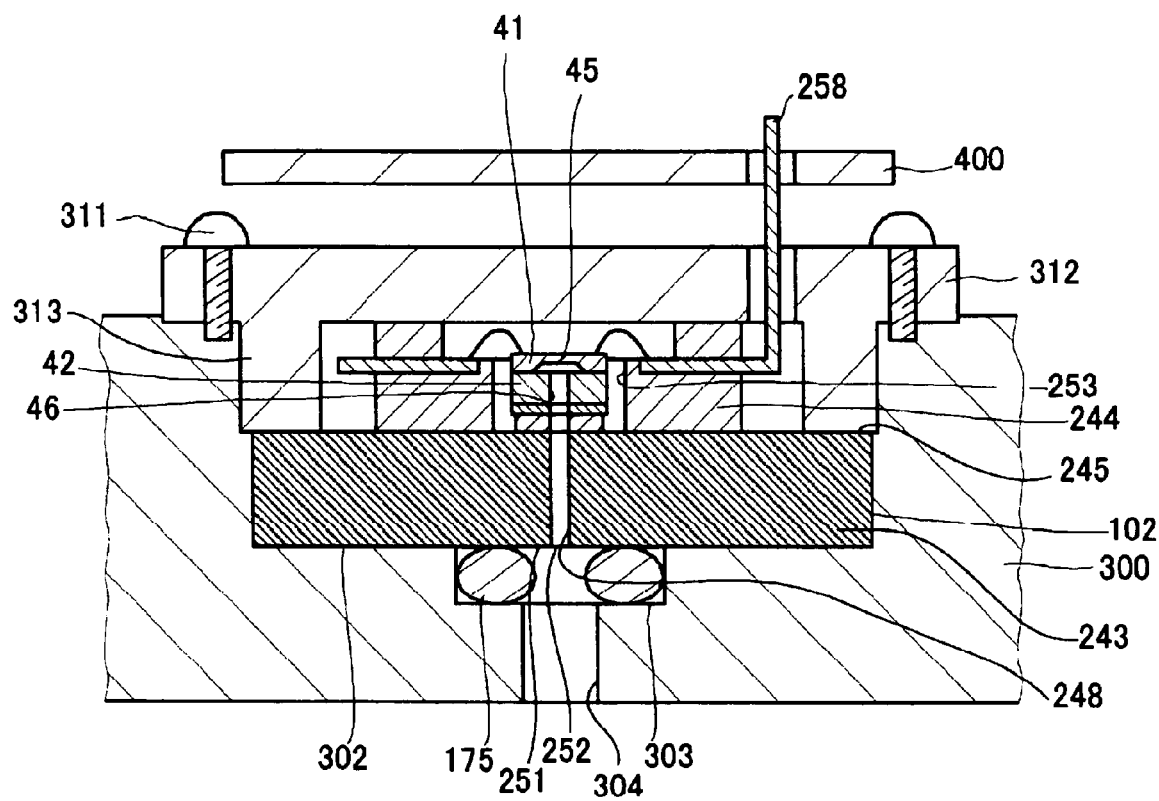
FIG. 14 illustrates a cross section of an eighth embodiment of a pressure sensor device, which incorporates the pressure sensor cell of FIG. 9, according to the present invention.

FIG. 14 is a cross sectional view showing an eighth embodiment of a pressure sensor device according to the present invention. Here, the pressure sensor device is similar to the embodiment of FIG. 3, but includes the pressure sensor cell 102 of the embodiment of FIG. 9 contained in the first stepped recess 302 formed in the enclosure 300, over which a fixture 312 is set to be secured to the enclosure 300 with fasteners 311. On the bottom face of the fixture 312, a downward protrusion 313 is provided to protrude from the bottom. The downward protrusion 313 is brought into contact with the support 245. The pressure sensor cell 102 is secured by pressure applied from the pressure introducing port 252 and reaction force applied from the fixture 312 against the pressure.

In the second stepped recess 303 formed in the bottom of the first stepped recess 302, an O-ring 175, which seals the space between the metallic plate member 243 and the enclosure 300, is accommodated. The O-ring 175, in the second stepped recess 303, seals the space between at least the bottom face of the second stepped recess 303 and the open end 251 of the metallic plate member 243. The O-ring 175 prevents the pressure-transmitting medium, introduced to the metallic plate member 243 through the through hole 304 in the enclosure 300, from flowing into sections other than the through hole 248 in the metallic plate member 243.

Moreover, the signal terminal 258 of the pressure sensor cell 102 is bent and channeled to directly connect to a printed circuit board 400 positioned near the enclosure 300 by connection measures such as soldering. The metallic plate member can be disk-like or of a shape with the support 245 provided over all around the periphery of the disk.

Figure 15:
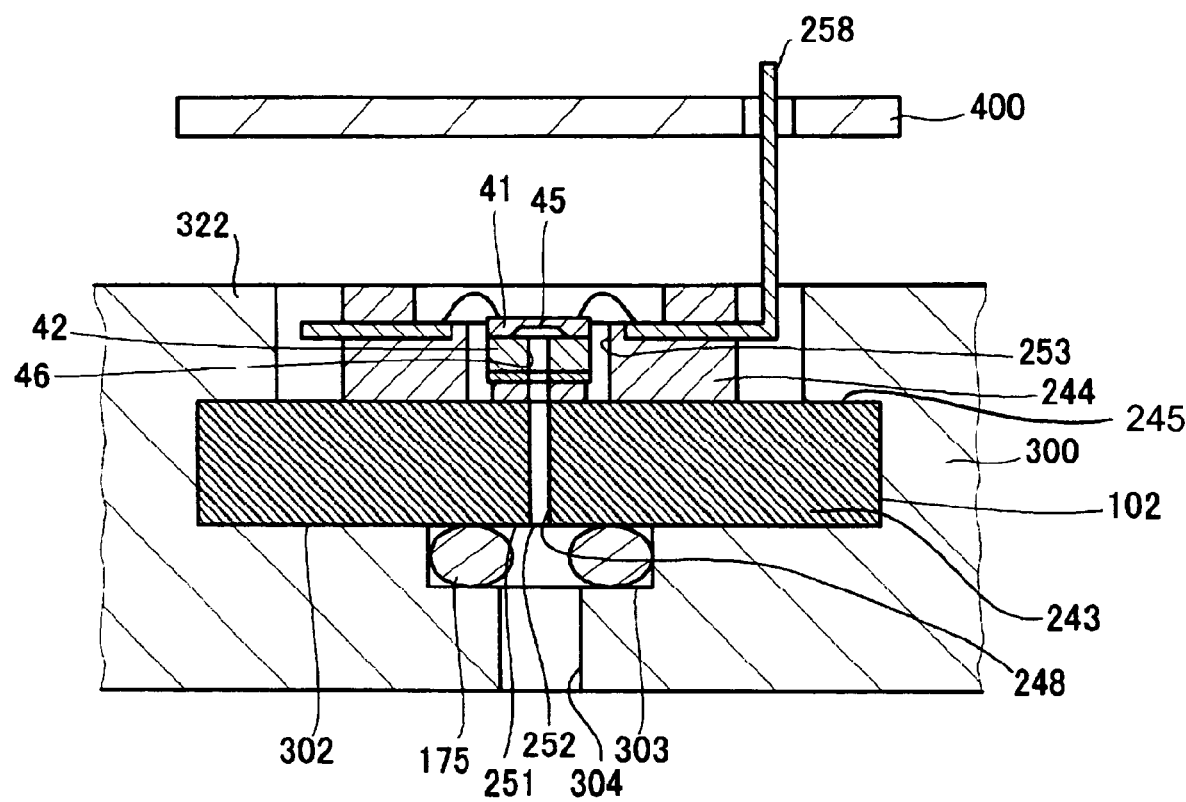
FIG. 15 illustrates a cross section of a ninth embodiment of a pressure sensor device, which incorporates the pressure sensor cell of FIG. 9, according to the present invention.
Figure 16:
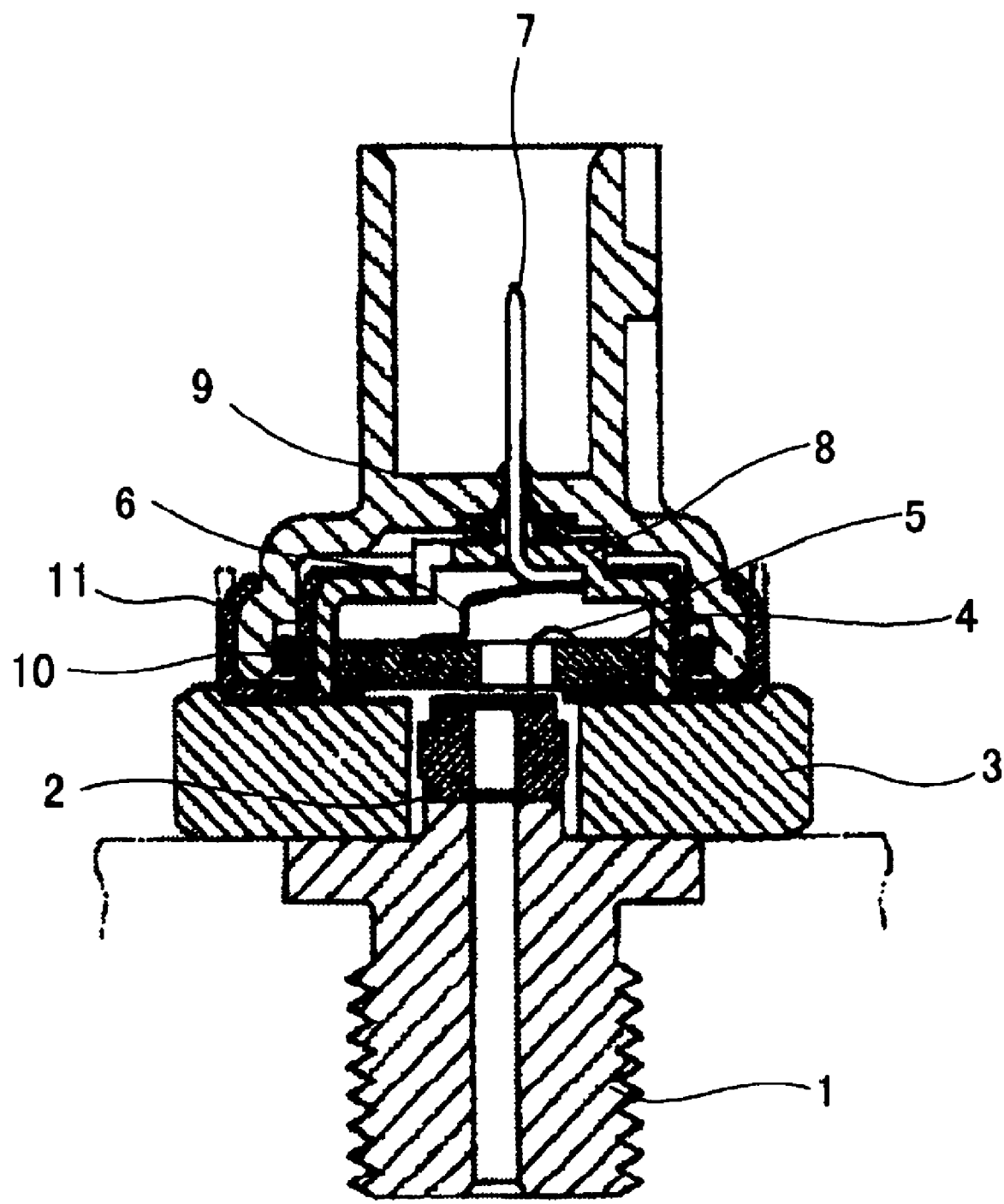
FIG. 16 illustrates a cross section of a conventional pressure sensor device.
Figure 17:
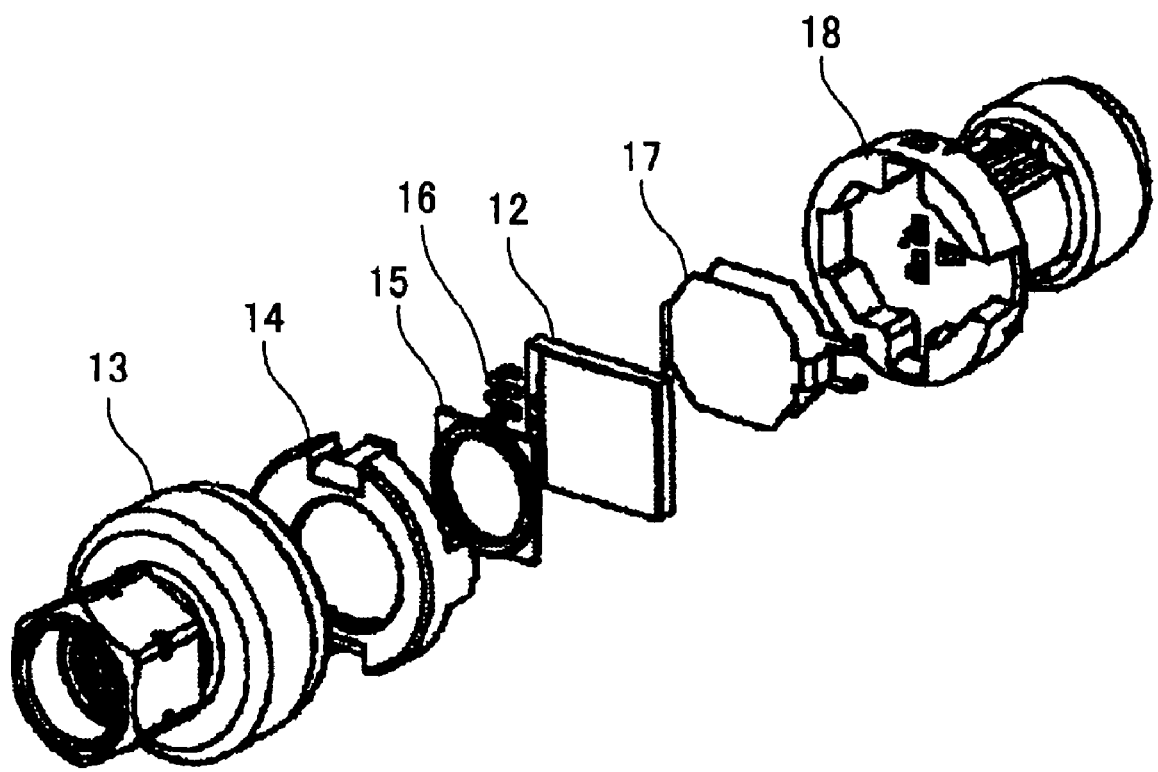
FIG. 17 is an exploded perspective view of another conventional pressure sensor device.
Figure 18:
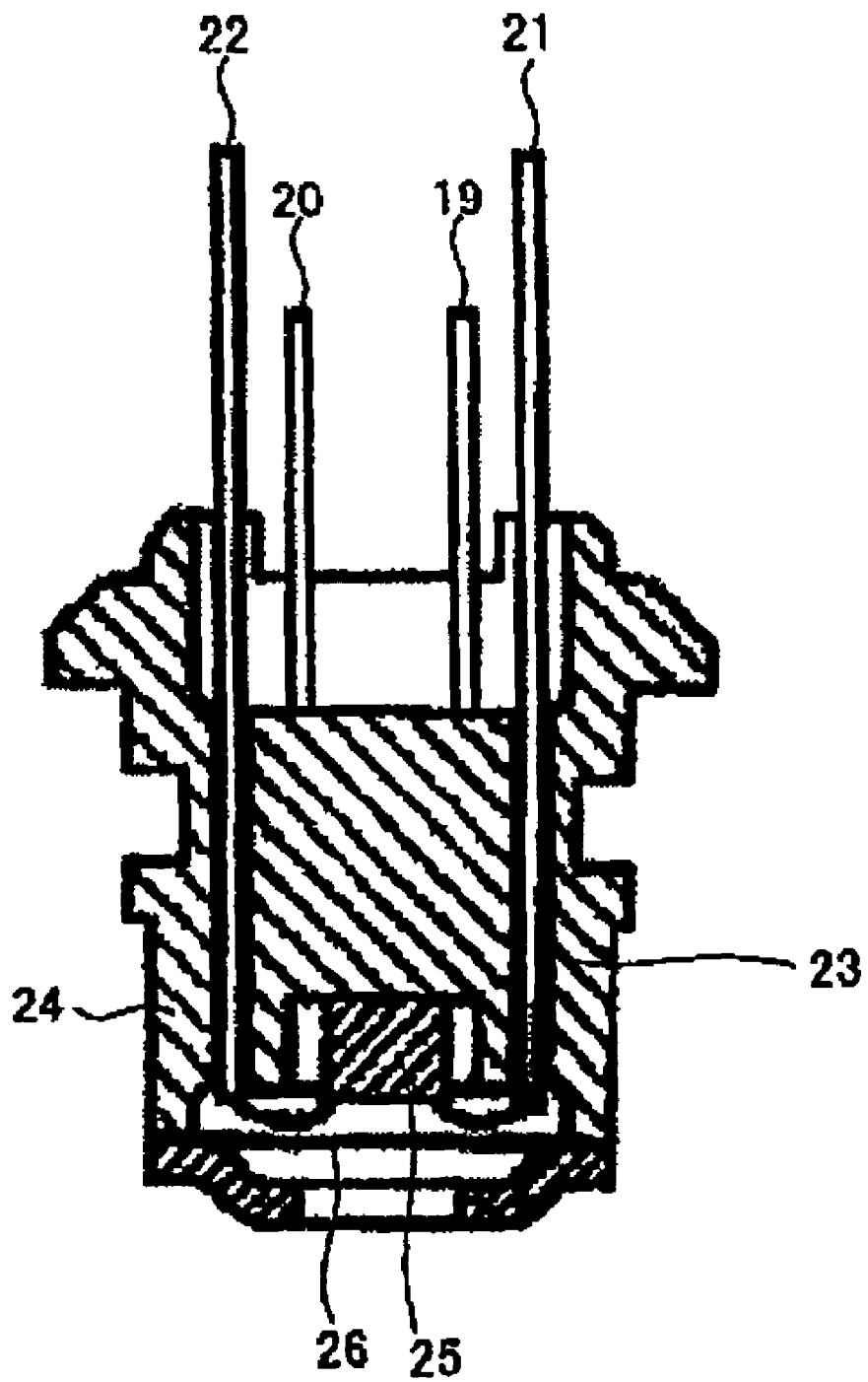
FIG. 18 illustrates a cross section of yet another conventional pressure sensor device.
Figure 19:
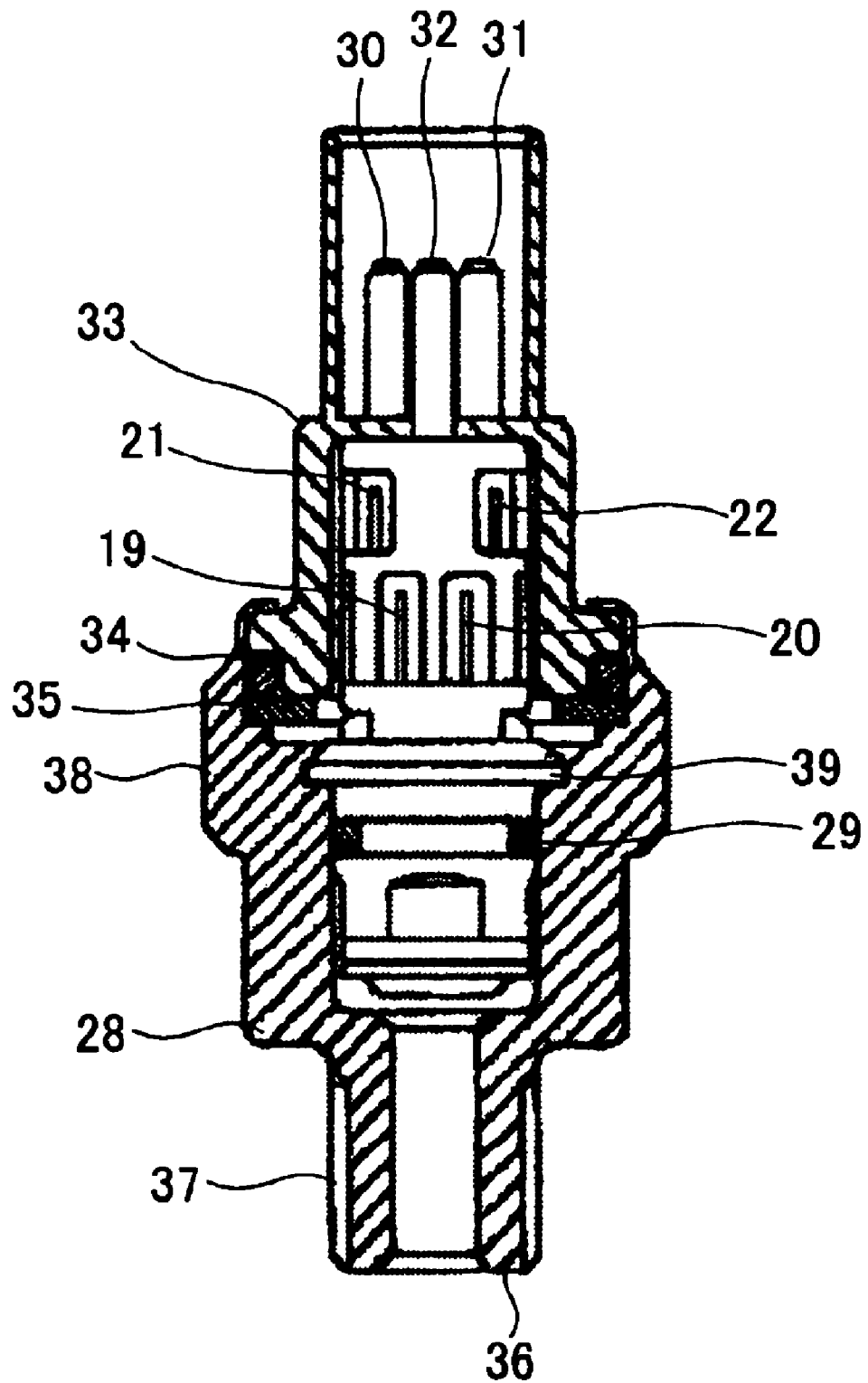
FIG. 19 illustrates a cross section of still yet another conventional pressure sensor device.

FIG. 15 is a cross sectional view showing a ninth embodiment of a pressure sensor device according to the present invention. Here, the pressure sensor device is similar to the embodiment of FIG. 14, but instead of securing the pressure sensor cell 102 with the fixture and fasteners 310, 311, secures the support 245 of the metallic plate member 243 contained in the first stepped recess 302 in the enclosure 300 by bending a tab 322 extending from the enclosure 300 with a machine or a tool to make the tab 322 engage the support 245. Therefore, in this embodiment, the fixture and screws 310, 311 are eliminated, by which the number of parts is reduced. Also, the O-ring 175, in the second stepped recess 303 in the enclosure 300, seals the space between at least the bottom face of the second stepped recess 303 and the open end 251 of the metallic plate member 243. The other arrangements are the same as those in the embodiment of FIG. 14.

In the foregoing, the present invention can be variously modified without being limited to the above-explained modes. For example, in the embodiment of FIG. 2 or 6, as a substitute for the O-ring 74, sealing the space between the bottom end of the housing section 63 of the connector member 61 and the inner bottom face of the containing section 69 of the joint member 62, or together with the O-ring 74, an O-ring can be provided to seal the space between the outer side face of the housing section 63 of the connector member 61 and the inner side face of the containing section 69 of the joint member 62 as in the embodiment of FIGS. 12 and 13.

Moreover, an arrangement can be provided in which, without providing the metal thin film 47 on the bottom face of the base member 42, the metallic pipe member 43 or metallic plate member 143 or 243 is bonded to the base member 42 with an adhesive such as epoxy resin. This way, the material cost can be reduced. Moreover, securing of the metallic pipe member 43 or the metallic plate member 143 or 243 to the base member 42, whether carried out by soldering or by bonding with an adhesive, can be selected as appropriate depending on the kind of a pressure-transmitting medium.

As explained above, the pressure sensor device according to the invention is useful for a pressure sensor device measuring high pressures of 1 MPa or above. The pressure sensor device is particularly suitable for that used in various kinds of devices for automobile use, medical use, industrial use, or consumer use.

According to the present invention, the output signal can be output directly from the pressure sensor chip. The signal output from the pressure sensor chip is transmitted to the signal terminal via the wire bonding. This minimizes the number of connections on the signal transmission path to lower the failure probability. Therefore, the long-term reliability of the pressure sensor device according to the present invention becomes high. Moreover, the smaller number of parts of the pressure sensor cell allows the pressure sensor cell to be obtained at a reduced cost. Therefore, the cost of the pressure sensor device can be reduced.

Furthermore, according to the present invention, the pressure-transmitting medium can be introduced to the pressure receiving section of the pressure sensor chip. This enables the pressure receiving section to directly receive the pressure of the medium without using silicon oil that largely affects the pressure sensor chip. Therefore, the accuracy and the reliability of the measured signal can be enhanced. Moreover, since the area of the section receiving pressure is limited to the back of the pressure receiving section of the silicon chip, the load applied to the pressure sensor body becomes small. This can downsize the pressure sensor with a simplified structure.

According to the present invention, a simpler structure with a smaller number of parts enables realization of a fail-safe leak-proof structure for the pressure-transmitting medium, which allows the pressure sensor device to be highly reliable. Moreover, the material cost and the assembly cost can be reduced. Furthermore, when the pressure sensor device is screwed to an oil-enclosing block, the stress created in the threaded section is lessened by the O-ring to make it possible to enhance accuracy and reliability of a measured signal. In addition, the pressure sensor device can be obtained in which the signal terminal is disposed at an opening section of an open end of the pressure introducing unit, that is, on the opposite side of the pressure introducing port.

According to the present invention, the pressure sensor chip and the base piece can be joined while maintaining a high air tightness between them. This enables realization of a highly airtight structure.

According to the present invention, since the base piece can be made of the same material as that of the pressure sensor chip, there is no difference in the coefficient of thermal expansion between the two components, by which no thermal stress is produced in the pressure sensor chip. While, around the junction of the base piece and the pressure introducing unit, thermal stress is produced due to the difference in coefficient of thermal expansion between the two. However, the base piece keeps the pressure sensor chip away from the junction to make it possible to reduce the influence of the thermal stress on the pressure sensor chip.

According to the present invention, the joining strength becomes high when the pressure introducing unit and the base piece are joined by metallic material, such as gold/tin eutectic solder or high temperature solder. Therefore, reliability of the joint of the pressure introducing unit and the base piece can be enhanced.

According to the present invention, the materials forming the metallic thin film with a three layer structure provided on the glass base piece, chromium on one side is excellent in adhesion to glass. Moreover, gold on the other side is suitable for joining the metallic pressure introducing unit to the metallic thin film with the gold/tin eutectic solder or high temperature solder. Furthermore, platinum provided between the gold and the chromium prevents the gold and the chromium from being brought into unfavorable contact with each other. By providing the metallic thin film with such a three layer structure, the joining strength can be enhanced when the metallic pressure introducing unit and the glass base piece are joined by using the gold/tin eutectic solder or high temperature solder.

According to the present invention, the pressure of the pressure-transmitting medium acts on the stepped portion of the pressure introducing unit so as to press the stepped portion against the end section of the resin case on the side of the open end of the pressure introducing unit. This can ensure high structural reliability under an applied pressure.

According to the present invention, the use of an adhesive in securing the base piece and the pressure introducing unit to each other can reduce the material cost.

According to the present invention, the pressure introducing unit made up of a metallic plate piece can reduce the material cost lower than that a pressure introducing unit formed of a metallic pipe piece.

According to the present invention, the end portion of the pressure introducing unit protruding outside from each end face of the resin case can be used as a support for securing a different piece such as a connector piece to the pressure introducing unit with the different piece being made in contact with the portion. This way, the pressure sensor cell or the pressure sensor device can measure a high pressure range.

According to the present invention, a different piece, such as a connector piece, can be secured to the pressure introducing unit with the different piece contacting the support of the pressure introducing unit protruding outside from each end face of the resin case. Therefore, the pressure sensor cell or the pressure sensor device can measure a high pressure range.

The pressure sensor device according to the invention produces various effects as follows. Since the number of connections on the signal transmission path to the outside is kept to a minimum, a failure probability is lowered to make it possible to obtain a pressure sensor device with a high long-term reliability. Moreover, a lower cost pressure sensor with a small number of parts can be obtained. In addition, variation in the output signal due to an influence of silicon oil can be avoided to enhance the accuracy and the reliability of the measured signal. Furthermore, when the pressure sensor device is screwed to a block, the stress created in the threaded section applied to the pressure sensor cell is lessened to make it possible to enhance the accuracy and reliability of the measured signal. In addition, the pressure sensor device can be obtained in which the signal terminal is disposed on the opposite side of the pressure introducing port.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosures of the priority applications, JP 2003-307265 and 2004-130368, in their entirety, including the drawings, claims, and the specifications thereof, are incorporated herein by reference.

What is claimed is:

1. A pressure sensor cell comprising:
   a pressure sensor chip having a pressure receiving section for receiving pressure and a converting unit for converting strain of the pressure receiving section to an electric signal, the strain being exerted by the pressure received by the pressure receiving section;
   a base member having a first face, a second face, and a through hole extending through the first face and the second face;
   a metallic pressure introducing unit having a first face, a second face, and a through hole extending through the first face and the second face; and
   a resin case having a signal terminal for outputting the electric signal from the converting unit of the pressure sensor chip,
   wherein the pressure receiving section faces the through hole of the base member, and the pressure sensor chip is joined to the second face of the base member,
   wherein the through hole of the pressure introducing unit communicates with the through hole of the base member, and the second face of the pressure introducing unit is joined to the first face of the base member,
   wherein the resin case is bonded to the pressure introducing unit, and
   wherein the pressure sensor chip and the signal terminal are electrically connected by a wiring.

2. The pressure sensor cell according to ciaim 1, further including a metallic thin film on the first face of the base member.

3. The pressure sensor cell according to claim 2, further including a metallic material disposed between the pressure introducing unit and the base member, wherein the second face of the pressure introducing unit is joined to the first face of the base with the metallic thin film.

4. The pressure sensor cell according to claim 1, wherein the second face of the pressure introducing unit is bonded to the first face of the base member with an adhesive.

5. The pressure sensor cell according to claim 3, wherein the pressure introducing unit comprises one of a metallic plate or a metallic pipe.

6. The pressure sensor cell according to claim 4, wherein the pressure introducing unit comprises one of a metallic plate or a metallic pipe.

7. The pressure sensor cell according to claim 1, wherein the base member is made of glass and the pressure sensor chip is joined to the glass base member by electrostatic bonding.

8. The pressure sensor cell according to claim 1, wherein the base member and the pressure sensor chip are both made of silicon, and the pressure sensor chip is joined to the base member with a sealing glass.

9. The pressure sensor cell according to claim 1, wherein the pressure introducing unit is made of the 42 alloy, with at least one of nickel and gold plating.

10. A pressure sensor cell comprising:
    a pressure sensor chip having a pressure receiving section for receiving pressure and a converting unit for converting strain of the pressure receiving section to an electric signal, the strain being exerted by the pressure received by the pressure receiving section;
    a base member having a first face, a second face, and a through hole extending through the first face and the second face;
    a metallic pressure introducing unit having a first face, a second face, and a through hole extending through the first face and the second face;
    a resin case having a signal terminal for outputting the electric signal from the converting unit of the pressure sensor chip; and
    a metallic thin film on the first face of the base member;
    wherein the pressure receiving section faces the throuah hole of the base member, and the pressure sensor chip is joined to the second face of the base member;
    wherein the through hole of the pressure introducing unit communicates with the through hole of the base member, and the second face of the pressure introducing unit is joined to the first face of the base member;
    wherein the resin case is bonded to the pressure introducing unit;
    wherein the pressure sensor chip and the signal terminal are electrically connected by a wiring;
    wherein the metallic thin film is formed with three layers, including a chromium film, a platinum film, and a gold film.

11. The pressure sensor cell according to claim 1, wherein the pressure introducing unit has a stepped portion protruding outwardly from a side thereof at a position midway from the first and second faces thereof, and wherein the stepped portion is bonded to the resin case.

12. The pressure sensor cell according to claim 1, wherein the pressure introducing unit protrudes outside more than an end face of the resin case at each end thereof in at least one direction.

13. The pressure sensor cell according to claim 1, wherein the pressure introducing unit has a support on the outside more than an end face of the resin case at each end thereof in at least one direction, the support being in contact with a different member that is integrated together with the pressure introducing unit.

14. A pressure sensor device comprising:
    a pressure sensor cell comprising:
       a pressure sensor chip having a pressure receiving section for receiving pressure and a converting unit for converting strain of the pressure receiving section to an electric signal, the strain being exerted by pressure received by the pressure receiving section;
       a base member having a first face, a second face, and a through hole extending through the first face and the second face;
       a metallic pressure introducing unit having a first face, a second face, and a through hole extending through the first face and the second face; and
       a resin case having a signal terminal for outputting the electric signal from the converting unit of the pressure sensor chip,
       wherein the pressure receiving section faces the through hole of the base member, and the pressure sensor chip is joined to the second face of the base member,
       wherein the through hole of the pressure introducing unit communicates with the through hole of the base member, and the second face of the pressure introducing unit is joined to the first face of the base member,
       wherein the resin case is bonded to the pressure introducing unit, and wherein the pressure sensor chip and the signal terminal are electrically connected by a wiring; and means for mounting the pressure sensor cell to an enclosure.

15. The pressure sensor device according to claim 14, wherein the mounting means comprises:

a connector member provided with a disposing section for disposing the pressure sensor cell therein, the connector member having an output terminal that is integrally molded therewith, one end of the output terminal being electrically connected to the signal terminal of the pressure sensor cell and the other end of the output terminal projecting externally outwardly; and a joint member comprising:

a threaded section having a threaded portion and a through hole extending through the threaded portion;

a containing section having a securing section for securing the connector member and containing the pressure sensor cell disposed in the connector member; and a sealing unit;

wherein the pressure sensor cell is disposed in the connector member so that an opening of the through hole on the first face of the pressure introducing unit communicates with a pressure-transmitting medium from the enclosure, wherein the signal terminal of the pressure sensor cell is electrically connected to the output terminal, wherein the pressure sensor cell, the connector member, and the joint member are joined, with the pressure sensor cell disposed between the connector member and the joint member so that the through hole of the threaded section communicates with the through hole of the pressure introducing unit, and wherein the sealing unit seals a space between the pressure introducing unit and the joint member.

16. The pressure sensor device according to claim 14, wherein the mounting means comprises a fixture for holding the sensor cell in a recess formed in the enclosure, the fixture having an opening through which the signal terminal extends externally outwardly and being mounted to the enclosure with fasteners.

17. The pressure sensor device according to claim 14, wherein the mounting means comprises a tab for holding the sensor cell in a recess formed in the enclosure, the tab having an opening through which the signal terminal extends externally outwardly, the tab securing the sensor cell to the enclosure.

18. The pressure sensor device according to claim 14, further including a metallic thin film on the first face of the base member.

19. The pressure sensor device according to claim 18, further including a metallic material disposed between the pressure introducing unit and the base member, wherein the second face of the pressure introducing unit is joined to the first face of the base with the metallic thin film.

20. The pressure sensor device according to claim 14, wherein the second face of the pressure introducing unit is bonded to the first face of the base member with an adhesive.

21. The pressure sensor device according to claim 19, wherein the pressure introducing unit comprises one of a metallic plate or a metallic pipe.

22. The pressure sensor device according to claim 20, wherein the pressure introducing unit comprises one of a metallic plate or a metallic pipe.

23. The pressure sensor device according to claim 14, wherein the base member is made of glass and the pressure sensor chip is joined to the glass base member by electrostatic bonding.

24. The pressure sensor device according to claim 14, wherein the base member and the pressure sensor chip are both made of silicon, and the pressure sensor chip is joined to the base member with a sealing glass.

25. The pressure sensor device according to claim 14, wherein the pressure introducing unit is made of the 42 alloy, with at least one of nickel and gold plating.

26. A pressure sensor device comprising:

pressure sensor cell comprising:

a pressure sensor chip having a pressure receiving section for receiving pressure and a converting unit for converting strain of the pressure receiving section to an electric signal, the strain being exerted by pressure received by the pressure receiving section;

a base member having a first face, a second face, and a through hole extending through the first face and the second face;

a metallic pressure introducing unit having a first face, a second face, and a through hole extending through the first face and the second face;

a resin case having a signal terminal for outputting the electric signal from the converting unit of the pressure sensor chip;

a metallic thin film on the first face of the base member; and means for mounting the pressure sensor cell to an enclosure wherein the pressure receiving section faces the through hole of the base member, and the pressure sensor chip is joined to the second face of the base member;

wherein the through hole of the pressure introducing unit communicates with the through hole of the base member, and the second face of the pressure introducing unit is joined to the first face of the base member;

wherein the resin case is bonded to the pressure introducing unit; and wherein the pressure sensor chip and the signal terminal are electrically connected by a wiring; and wherein the metallic thin film is formed with three layers, including a chromium film, a platinum film, and a gold film.

27. The pressure sensor device according to claim 14, wherein the pressure introducing unit has a stepped portion protruding outwardly from a side thereof at a position midway from the first and second faces thereof, and wherein the stepped portion is bonded to the resin case.

28. The pressure sensor device according to claim 14, wherein the pressure introducing unit protrudes outside more than an end face of the resin case at each end thereof in at least one direction.

29. The pressure sensor device according to claim 14, wherein the pressure introducing unit has a support on the outside more than an end face of the resin case at each end thereof in at least one direction, the support being in contact with a different member that is integrated together with the pressure introducing unit.

* * * * *